(12) United States Patent
Lee et al.

(10) Patent No.: US 12,366,975 B2
(45) Date of Patent: *Jul. 22, 2025

(54) AUTOMATED ERROR CORRECTION WITH MEMORY REFRESH

(71) Applicant: Micron Technology, Inc., Boise, ID (US)

(72) Inventors: Hyun Yoo Lee, Boise, ID (US); Kang-Yong Kim, Boise, ID (US)

(73) Assignee: Micron Technology, Inc, Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/582,356

(22) Filed: Feb. 20, 2024

(65) Prior Publication Data

US 2024/0192862 A1    Jun. 13, 2024

Related U.S. Application Data

(63) Continuation of application No. 17/460,013, filed on Aug. 27, 2021, now Pat. No. 11,907,544.
(Continued)

(51) Int. Cl.
*G06F 3/06* (2006.01)

(52) U.S. Cl.
CPC .......... *G06F 3/0619* (2013.01); *G06F 3/0656* (2013.01); *G06F 3/0679* (2013.01)

(58) Field of Classification Search
CPC .... G06F 3/0619; G06F 3/0656; G06F 3/0679; G06F 11/1048; G11C 2029/0411;
(Continued)

(56) References Cited

U.S. PATENT DOCUMENTS

| | | |
|---|---|---|
| 6,704,230 B1 | 3/2004 | Debrosse et al. |
| 7,505,295 B1 | 3/2009 | Nataraj et al. |

(Continued)

FOREIGN PATENT DOCUMENTS

| | | |
|---|---|---|
| KR | 20050064887 | 6/2005 |
| KR | 20180003468 | 1/2018 |

(Continued)

OTHER PUBLICATIONS

"International Preliminary Report on Patentability", Application No. PCT/US2021/047766, Feb. 28, 2023, 7 pages.
(Continued)

*Primary Examiner* — Hiep T Nguyen
(74) *Attorney, Agent, or Firm* — Colby Nipper PLLC

(57) ABSTRACT

Described apparatuses and methods provide automated error correction with memory refresh. Memory devices can include error correction code (ECC) technology to detect or correct one or more bit-errors in data. Dynamic random-access memory (DRAM), including low-power double data rate (LPPDR) synchronous DRAM (SDRAM), performs refresh operations to maintain data stored in a memory array. A refresh operation can be a self-refresh operation or an auto-refresh operation. Described implementations can combine ECC technology with refresh operations to determine a data error with data that is being refreshed or to correct erroneous data that is being refreshed. In an example, data for a read operation is checked for errors. If an error is detected, a corresponding address can be stored. Responsive to the corresponding address being refreshed, corrected data is stored at the corresponding address in conjunction with the refresh operation. Alternatively, data being refreshed can be checked for an error.

20 Claims, 13 Drawing Sheets

Related U.S. Application Data

(60) Provisional application No. 63/131,749, filed on Dec. 29, 2020, provisional application No. 63/072,715, filed on Aug. 31, 2020.

(58) Field of Classification Search
CPC ............ G11C 29/52; G11C 2211/4062; G11C 7/1006; G11C 11/406
See application file for complete search history.

(56) References Cited

U.S. PATENT DOCUMENTS

| | | | |
|---|---|---|---|
| 8,898,543 | B2 | 11/2014 | Jo et al. |
| 8,942,028 | B1 | 1/2015 | Hu |
| 10,319,461 | B2 | 6/2019 | Kwon et al. |
| 10,482,947 | B2 | 11/2019 | Cox et al. |
| 11,048,583 | B1 | 6/2021 | Hokenmaier et al. |
| 11,170,868 | B2 | 11/2021 | Ryu et al. |
| 11,301,317 | B2 | 4/2022 | Kim et al. |
| 11,314,589 | B2 | 4/2022 | Bains et al. |
| 11,327,838 | B2 | 5/2022 | Park et al. |
| 11,385,832 | B2 | 7/2022 | Murayama |
| 11,416,335 | B2 | 8/2022 | Cho et al. |
| 11,687,407 | B2 | 6/2023 | Kim et al. |
| 11,907,544 | B2 * | 2/2024 | Lee ................. G11C 29/52 |
| 12,086,026 | B2 | 9/2024 | Song et al. |
| 2004/0184327 | A1 | 9/2004 | Okuda |
| 2007/0133315 | A1 | 6/2007 | Kang et al. |
| 2008/0046796 | A1 | 2/2008 | Dell et al. |
| 2009/0049364 | A1 | 2/2009 | Jo et al. |
| 2011/0040924 | A1 | 2/2011 | Selinger |
| 2012/0060066 | A1 | 3/2012 | Nagadomi et al. |
| 2013/0159812 | A1 | 6/2013 | Loh et al. |
| 2014/0164874 | A1 | 6/2014 | Franceschini et al. |
| 2015/0212885 | A1 | 7/2015 | Coteus et al. |
| 2016/0004596 | A1 | 1/2016 | D'abreau |
| 2016/0026524 | A1 | 1/2016 | Hoya |
| 2016/0139837 | A1 | 5/2016 | Welker et al. |
| 2016/0147599 | A1 | 5/2016 | Kim |
| 2016/0283318 | A1 | 9/2016 | Das et al. |
| 2016/0301428 | A1 | 10/2016 | Andrade Costa et al. |
| 2016/0328286 | A1 | 11/2016 | Hoekstra et al. |
| 2017/0123904 | A1 | 5/2017 | Park et al. |
| 2017/0322843 | A1 | 11/2017 | Hsu et al. |
| 2018/0210787 | A1 | 7/2018 | Bains et al. |
| 2019/0087263 | A1 | 3/2019 | Cha et al. |
| 2019/0140668 | A1 | 5/2019 | Kim et al. |
| 2019/0220352 | A1 | 7/2019 | Cha et al. |
| 2019/0294378 | A1 | 9/2019 | Ware et al. |
| 2019/0324854 | A1 | 10/2019 | Park et al. |
| 2020/0104205 | A1 | 4/2020 | Noguchi et al. |
| 2020/0135291 | A1 | 4/2020 | Takahashi et al. |
| 2020/0371869 | A1 | 11/2020 | Park et al. |
| 2021/0064461 | A1 | 3/2021 | Veches |
| 2022/0066655 | A1 | 3/2022 | Lee et al. |
| 2022/0066870 | A1 | 3/2022 | Choi et al. |
| 2022/0066874 | A1 | 3/2022 | Kim et al. |
| 2022/0300370 | A1 | 9/2022 | Song et al. |
| 2025/0004875 | A1 | 1/2025 | Song et al. |

FOREIGN PATENT DOCUMENTS

| | | |
|---|---|---|
| KR | 20190049710 | 5/2019 |
| WO | 2022047040 | 3/2022 |
| WO | 2022047266 | 3/2022 |
| WO | 2022198193 | 9/2022 |

OTHER PUBLICATIONS

"International Preliminary Report on Patentability", Application No. PCT/US2021/048112, Feb. 28, 2023, 7 pages.

"International Search Report and Written Opinion", Application No. PCT/US2021/047766, Dec. 1, 2021, 11 pages.

"International Search Report and Written Opinion", Application No. PCT/US2021/048112, Dec. 23, 2021, 10 pages.

"Non-Final Office Action", U.S. Appl. No. 17/460,013, filed Jun. 7, 2023, 12 pages.

"Non-Final Office Action", U.S. Appl. No. 17/412,050, filed Nov. 3, 2022, 15 pages.

"Notice of Allowance", U.S. Appl. No. 17/412,050, filed Feb. 16, 2023, 6 pages.

"Notice of Allowance", U.S. Appl. No. 17/460,013, filed Oct. 12, 2023, 5 pages.

"International Preliminary Report on Patentability", Application No. PCT/US2022/071134, Sep. 12, 2023, 7 pages.

"International Search Report and Written Opinion", Application No. PCT/US2022/071134, Jun. 30, 2022, 10 pages.

"Non-Final Office Action", U.S. Appl. No. 17/654,354, filed Oct. 31, 2023, 22 pages.

"Notice of Allowance", U.S. Appl. No. 17/654,354, filed May 2, 2024, 7 pages.

"Wikipedia—Error Correction Code", Retrieved at: https://en.wikipedia.org/w/index.php?title=Error_correction_code&oldid=1006762637—on Feb. 24, 2021, 13 pages.

"Wikipedia—LPDDR", Retrieved at: https://en.wikipedia.org/w/index.php?title=LPDDR&oldid=1 008658262—on Feb. 24, 2021, 6 pages.

O, et al., "Exploring Energy-Efficient DRAM Array Organizations", IEEE 54th International Midwest Symposium on Circuits and Systems https://ieeexplore.ieee.org/stamp/stamp.jsp?arnumber=6026486, Sep. 2011, 4 pages.

* cited by examiner

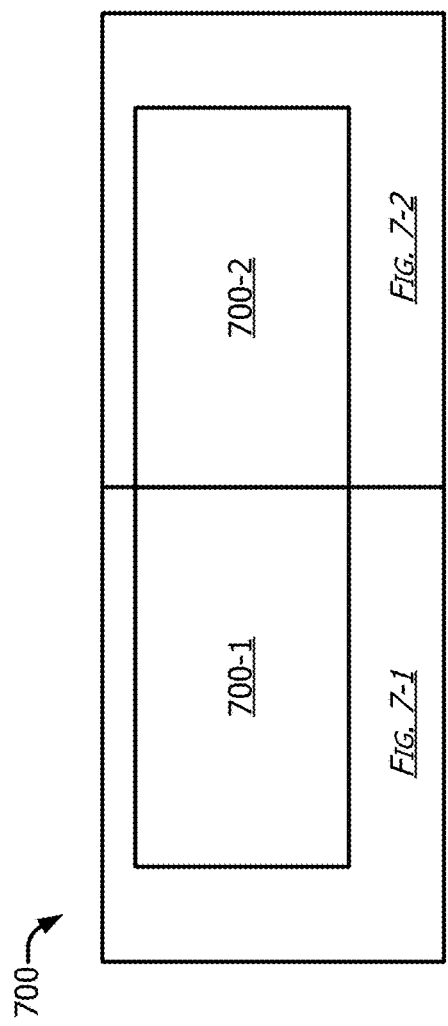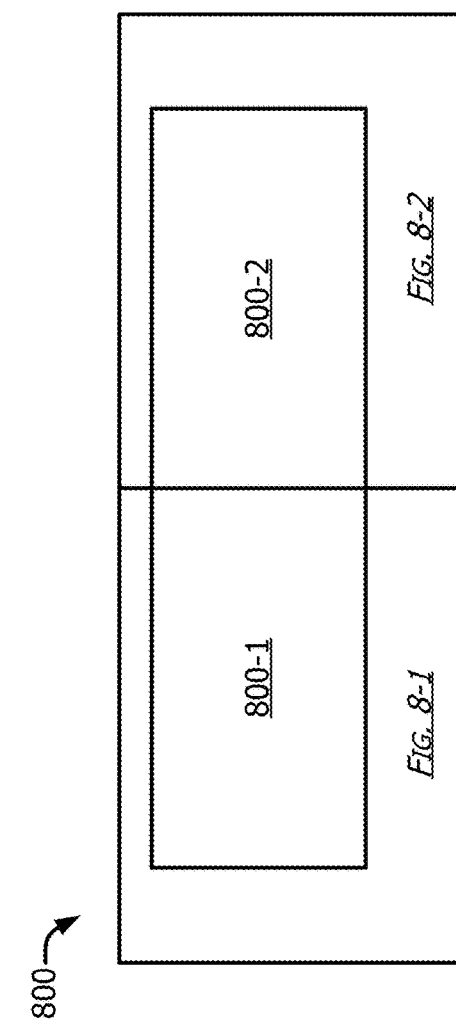

AUTOMATED ERROR CORRECTION WITH MEMORY REFRESH

CROSS-REFERENCE TO RELATED APPLICATION(S)

This application is a continuation of and claims priority to U.S. patent application Ser. No. 17/460,013, filed 27 Aug. 2021, which claims the benefit of U.S. Provisional Application No. 63/131,749, filed 29 Dec. 2020, and the benefit of U.S. Provisional Application No. 63/072,715, filed 31 Aug. 2020, the disclosures of which are hereby incorporated by reference in their entireties herein.

BACKGROUND

Computers, smartphones, and other electronic devices operate using processors and memories. A processor executes code based on data to run applications and provide features to a user. The processor obtains the code and the data from a memory that can store information. Thus, like a processor's speed or number of cores, a memory's characteristics can impact the performance of an electronic device. Different types of memory have different characteristics. Memory types include volatile memory and nonvolatile memory, such as random access memory (RAM) and flash memory, respectively. RAM can include static RAM (SRAM) and dynamic RAM (DRAM).

Demands on the different types of memory continue to evolve and grow. For example, as processors are engineered to execute code faster, such processors can benefit from accessing memories more quickly. Applications may also operate on ever-larger data sets that use ever-larger memories. Due to battery-powered electronic devices and power-hungry data centers, energy-usage constraints are becoming more prevalent for memory systems. Further, manufacturers may seek physically smaller memories as the form factors of portable electronic devices continue to shrink. Accommodating these various demands is thus complicated by the diverse strengths and capabilities of different types of memories.

BRIEF DESCRIPTION OF THE DRAWINGS

Apparatuses of and techniques for automated error correction with memory refresh are described with reference to the following drawings. The same numbers are used throughout the drawings to reference like features and components:

FIGS. 7, 7-1, 7-2, 8, 8-1, and 8-2 illustrate example timing diagrams depicting aspects of automated error correction with memory refresh;

DETAILED DESCRIPTION

Overview

Figure 1:
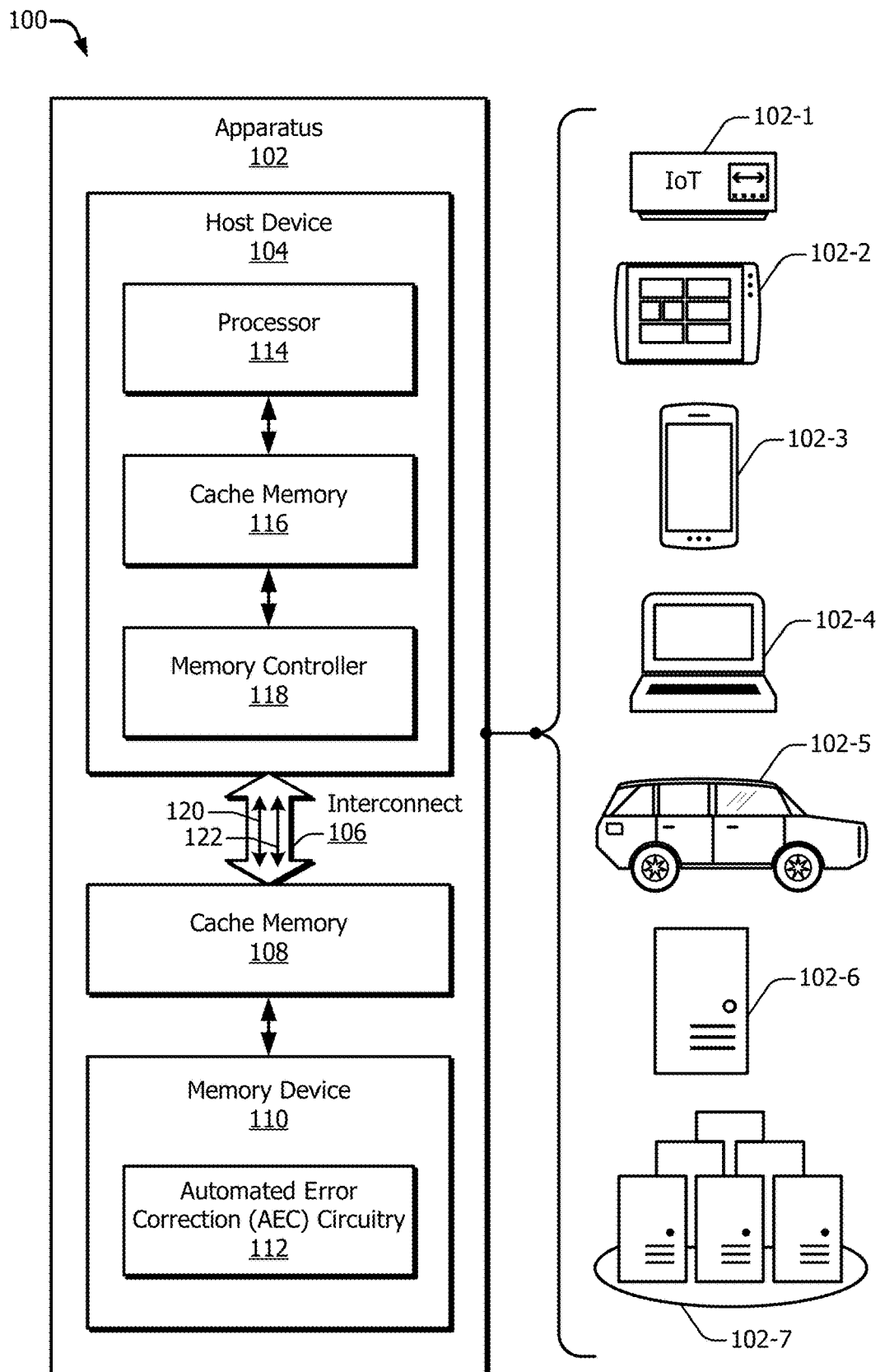
FIG. 1 illustrates example apparatuses that can implement automated error correction with memory refresh.

Processors and memory work in tandem to provide features to users of computers and other electronic devices. Generally, an electronic device can provide enhanced features, such as high-resolution graphics and artificial intelligence, as a processor and memory tandem operate faster. For decades, advances in processors have often outpaced those in memory technologies. Memory, such as dynamic random-access memory (DRAM), can therefore cause a bottleneck during program execution due to the disparity in speed between processors and memories.

There are multiple types of DRAM, including synchronous DRAM (SDRAM). Low-power (LP) double data rate (DDR) memory, which is sometimes referred to as LPDDR or mobile DDR memory, is a DDR SDRAM that can use less power than some other types of DDR SDRAM. In some applications, LPDDR memory may also operate at higher data rates than other types of DDR SDRAM. Device manufacturers often use LPDDR memory in mobile devices, such as cellular phones and tablet computers, to extend battery life. Increasingly, cloud and web services companies use LPDDR memory in server applications to reduce electricity usage and therefore lower operational costs across large data centers.

Designing LPDDR for different use cases and applications, however, is challenging. One example application involves high data reliability. DRAM memory cell data can be corrupted due to soft errors. Soft errors reflect a one-time or rare event in which data in a memory cell is incorrectly changed, but the memory cell is not actually defective. Ambient radiation, for instance, can create a soft error. As memory cells become smaller to increase the capacity of memories, cross-cell interference can also increasingly cause soft errors. Some types of DRAM can include mechanisms on the memory die to combat these soft errors.

On-die mechanisms to increase reliability for DDR SDRAM, including low-power DDR (LPDDR) SDRAM, can be improved by implementing an error-correction mechanism, such as error correction code (ECC) logic that includes an ECC engine. Using an ECC mechanism can reduce at least the external effects of data corruption and may improve memory and system performance. Further, as mobile devices become more powerful to handle computing, graphics, artificial intelligence (AI), and other processing operations, improvements in the reliability of LPDDR DRAM become more important to users and designers. Examples of ECC levels include 1-bit ECC (ECC1), 2-bit ECC (ECC2), and 3-bit ECC (ECC3). Thus, memory reliability can be improved by including an ECC engine on, for instance, each memory die of a memory module with multiple dies.

There are, however, other factors to consider with LPPDR memory. An LPPDR memory with ECC can receive a read command for a memory address from a host device. In response to the read command, a memory die extracts data stored in the memory cells represented by the address. The die transmits the extracted data from a memory array to the ECC logic of the die. The ECC logic can use one or more of various techniques to check that each bit is correct. In some cases, because of various factors, such as a temperature of an operating environment, a manufacturing process, or even background radiation, some bits have the wrong value-which can correspond to a soft error.

Depending on the ECC level, the ECC logic can detect and correct at least one-bit errors in the data being requested by the read command. Once the error is corrected, the ECC logic transmits the corrected data to an output interface (e.g., a data bus or DQ logic). The output interface of the die transmits the corrected data to the host device, which has an application or process that requested the data. Thus, the ECC logic can correct an error in data that has been read from the memory, and the output interface can transmit the corrected data to the requesting host device. The data stored in the memory array, on the other hand, is still corrupted with an error.

In other words, with some approaches to ECC mechanisms, the ECC logic does not write the corrected data back to the memory cells that are storing the corrupt data. This can lead to uncorrectable errors over time. As noted above, memories with smaller manufacturing processes can offer more data capacity in a given size. The smaller manufacturing processes result in more-closely packed memory cells. These memory cells can therefore cause cross interference that produces soft errors at a higher rate than for memory cells with larger manufacturing processes. Accordingly, with modern manufacturing processes, the likelihood is increasing that multiple bits within a single data block (e.g., a byte or a multi-byte block) will become corrupted at the same time. Any given level of ECC typically has a maximum number of bit errors that can be corrected per data block, such as one or two bit-errors. Consequently, leaving detected bit errors uncorrected in the memory array is becoming increasingly risky as manufacturing processes shrink the size of memory cells.

This data corruption situation can develop in an environment with volatile memory, like DRAM. This can be an important consideration with DRAM memory, including LPDDR memory. With volatile memory, stored information is lost if power is not maintained. The cells of DRAM are made in part from capacitors, which each store a voltage level to represent a bit of data. Because the charge slowly drains from the capacitor, the data can be lost if the capacitor is not recharged. To maintain an appropriate charge on each capacitor, the DRAM can repeatedly (e.g., periodically) perform refresh operations. Refresh operations may be initiated and controlled by a memory controller outside the DRAM (e.g., using an auto-refresh command) or by operations performed internally (e.g., using a self-refresh operation).

During a self-refresh (SREF) operation, for instance, the DRAM refreshes data corresponding to a set of memory addresses (e.g., refresh addresses, which can include memory cell addresses, row addresses, bank addresses, and the like). To perform the SREF operation, the DRAM reads data from a memory cell corresponding to a refresh address into a temporary storage location (e.g., a sense amplifier) and writes the data back to the memory cell with the proper charge. This refresh operation restores a "full" charge on each capacitor. This refresh operation does not, however, automatically have knowledge of any data errors. Consequently, even with the ECC logic correcting data that is being read out of the memory device and forwarded to another device, a bit error at a memory cell remains after ECC and refresh operations have been performed. Further, each time corrupted data is read for a read command from the memory cell that continues to have a bit error, the ECC logic consumes additional power and introduces a delay to replace the bit error with the corrected bit value before forwarding the corrected data to a requesting device.

In contrast, consider the following discussion of techniques for automated error correction with memory refresh, which may be implemented as part of a volatile memory architecture, including a post-LPDDR5 architecture (e.g., an LPDDR6 architecture). In the described techniques, DRAM includes automated error correction (AEC) circuitry. The AEC circuitry includes error logic (e.g., ECC logic) and at least one buffer memory (e.g., a latch). The ECC logic can store in at least one latch one or more addresses of memory cells that are corrupt or contain errors (e.g., error addresses). When an auto- or self-refresh operation is being performed, the DRAM can compare refresh addresses to the error addresses.

If there is a match between a refresh address and an error address, the DRAM can correct the data error in conjunction with refreshing the memory cell(s) corresponding to the refresh address. The corrupted data can therefore be corrected once instead of each time the data is read out responsive to an external data access request. By correcting the data in the memory array, the AEC circuitry can prevent a corrupted data bit from remaining in a data block until it is joined by a second or third corrupted data bit, which risks becoming uncorrectable. Moreover, the data correction can be merged with, or be part of, a read-and-write-back operation that otherwise occurs as part of a refresh operation for the volatile DRAM. The operation may be implemented as, for instance, a read-modify-write operation. In these manners, the described techniques for automated error correction with memory refresh can improve not only data output reliability, but they may also maintain internal data integrity. This increased internal data integrity increases long-term data reliability and can improve the efficiency and performance of the system by reducing the number of ECC corrections during read operations.

This document describes numerous implementations. Consider an example implementation of automated error correction with memory refresh in which a DRAM with ECC logic is augmented with at least one buffer memory (e.g., a latch) that can store an error address. While or when a refresh operation is being performed, the AEC circuitry can compare refresh addresses to the error address stored in the latch. Responsive to an address match, the AEC circuitry can correct the error as part of refreshing a memory row including the memory cell corresponding to the matching address. In some implementations, the AEC circuitry may correct the data error by reading the error address from the latch, recomputing the corrected data using the ECC logic based on the corrupted data and an ECC value, and writing the corrected data back to the error address being refreshed.

In other implementations, the DRAM may include a buffer memory that stores the error address and the corresponding corrected data. The AEC circuitry stores the corrected data and the error address in the buffer memory in conjunction with correcting the data during a read operation. Subsequently, the AEC circuitry can read the corrected data from the latch and write the corrected data to the memory cell corresponding to the error address being refreshed without recomputing the corrected data. As compared to the latter approach, the former approach may use less buffer memory and less power due to energy expended to retain the corrected data. The latter approach, on the other hand, may use fewer computational resources by obviating a re-computation of the corrected data by the ECC logic.

Example implementations can also include using a read-modify-write operation to correct corrupted data. With a read-modify-write operation, the data from a refresh address that matches an error address is read from the refresh address into a temporary memory location (e.g., a sense amp of the memory array), modified based on corrected data output by the ECC logic, and written back to the refresh address with correct modification. Regardless of the correction scheme, data of a refresh address that matches an error address can be refreshed in conjunction with making a data correction. The incorrect data is thereby not returned to, nor maintained indefinitely in, the memory cells of the data. Error correction at the memory cell may lead to fewer errors accumulating over time. This can allow a DRAM to maintain higher reliability because larger numbers of simultaneous errors may exceed the ability of the ECC logic to correct errors while maintaining performance (e.g., data rate and latency performance).

Example Operating Environments

FIG. 1 illustrates, at 100 generally, example apparatuses 102 that can implement automated error correction with memory refresh. The apparatus 102 can be realized as, for example, at least one electronic device. Example electronic-device implementations include an internet-of-things (IoTs) device 102-1, a tablet device 102-2, a smartphone 102-3, a notebook computer 102-4 (or desktop computer), a passenger vehicle 102-5, a server computer 102-6, a server cluster 102-7 that may be part of cloud computing infrastructure or a data center, and a portion thereof (e.g., a printed circuit board (PCB)). Other examples of the apparatus 102 include a wearable device, such as a smartwatch or intelligent glasses; an entertainment device, such as a set-top box or video dongle, a smart television, or a gaming device; a motherboard or server blade; a consumer appliance; a vehicle or drone, or the electronic components thereof; industrial equipment; a security or other sensor device; and so forth. Each type of electronic device or other apparatus can include one or more components to provide some computing functionality or feature.

In example implementations, the apparatus 102 can include at least one host device 104, at least one interconnect 106, at least one cache memory 108, and at least one memory device 110. The host device 104 can include at least one processor 114, at least one cache memory 116, and at least one memory controller 118. The memory device 110 may be realized, for example, with a dynamic random-access memory (DRAM) die or module, including with a three-dimensional (3D) stacked DRAM device, such as a high bandwidth memory (HBM) device or a hybrid memory cube (HMC) device. The memory device 110 may operate as a main memory. Although not shown, the apparatus 102 can also include storage memory. The storage memory may be realized, for example, with a storage-class memory device, such as one employing 3D XPoint™ or phase-change memory (PCM), a hard disk or solid-state drive, or flash memory.

Regarding the host device 104, the processor 114 is coupled to the cache memory 116, and the cache memory 116 is coupled to the memory controller 118. The processor 114 is also coupled, directly or indirectly, to the memory controller 118. The host device 104 may include other components to form, for instance, a system-on-a-chip (SoC). The processor 114 may include or comprise a general-purpose processor, a central processing unit (CPU), a graphics processing unit (GPU), a neural network engine or accelerator, an application-specific integrated circuit (ASIC), a field-programmable gate array (FPGA) integrated circuit (IC), a communications processor (e.g., a modem or baseband processor), an SoC, and so forth. In operation, the memory controller 118 can provide a high-level or logical interface between the processor 114 and at least one memory (e.g., a memory that is external to the host device 104). The memory controller 118 can, for example, receive memory requests from the processor 114 and provide the memory requests to an external memory with appropriate formatting, timing, reordering, and so forth. The memory controller 118 can also forward to the processor 114 responses to the memory requests that the memory controller 118 receives from the external memory.

Regarding connections that are external to the host device 104, the host device 104 is coupled to the cache memory 108 via the interconnect 106. The cache memory 108 is coupled to the memory device 110, and the memory device 110 may be coupled to a storage memory (not shown). The host device 104 can also be coupled, directly or indirectly, to the memory device 110 or the storage memory via the interconnect 106. The depicted interconnect 106, as well as other interconnects (not shown) that communicatively couple together various components, enable data to be transferred between two or more components of the various components. Interconnect examples include a bus, a switching fabric, one or more wires that carry voltage or current signals, and so forth. The interconnect 106 can include at least one command and address bus 120 (CA bus 120) and at least one data bus 122 (DQ bus 122). Each bus may be implemented as a unidirectional bus or a bidirectional bus. The interconnect 106 may also include a clock bus (CK bus—not shown) that is part of or separate from the command and address bus 120. The CA and DQ buses 120 and 122 may be coupled to CA and DQ pins, respectively, of the memory device 110. In some implementations, the interconnect 106 may also include a chip-select (CS) I/O (not shown) that can, for example, be coupled to one or more CS pins of the memory device 110.

The depicted components of the apparatus 102 represent an example computing architecture with a hierarchical memory system. A hierarchical memory system may include memories at different levels, with each level having a memory with a different speed or capacity. As shown, the cache memory 116 is logically coupled between the processor 114 and the cache memory 108. The cache memories 116 and 108 are logically coupled between the processor 114 and the memory device 110. Here, the cache memory 116 is at a higher level of the hierarchical memory system than is the cache memory 108. Similarly, the cache memory 108 is at a higher level of the hierarchical memory system than is the memory device 110. A storage memory, in turn, can be deployed at a lower level than the main memory as represented by the memory device 110. At lower hierarchical levels, memories may have decreased speeds but increased capacities relative to memories at higher hierarchical levels.

Although various implementations of the apparatus 102 are depicted in FIG. 1 and described herein, an apparatus 102 can be implemented in alternative manners. For example, the host device 104 may include multiple cache memories, including multiple levels of cache memory, or may have no cache memory. In some cases, the host device 104 may omit the processor 114 or the memory controller 118. A memory, such as the memory device 110, may have a respective "internal" or "local" cache memory (not shown). Further, there may be no cache memory between the interconnect 106 and the memory device 110. Generally, the illustrated and described components may be implemented in alternative ways, including in distributed or shared memory systems. A given apparatus 102 may also include more, fewer, or different components.

The host device 104 and the various memories may be realized in multiple manners. In some cases, the host device 104 and the memory device 110 can both be disposed on, or physically supported by, a same printed circuit board (PCB) (e.g., a rigid or flexible motherboard). The host device 104 and the memory device 110 may additionally be integrated on a same IC or fabricated on separate ICs but packaged together. A memory device 110 may also be coupled to multiple host devices 104 via one or more interconnects 106 and may be able to respond to memory requests from two or more of the host devices 104. Each host device 104 may include a respective memory controller 118, or the multiple host devices 104 may share a common memory controller 118. An example computing system architecture with at least one host device 104 that is coupled to a memory device 110 is described below with reference to FIG. 2.

The electrical paths or couplings realizing the interconnect 106 can be shared between two or more memory components (e.g., modules, dies, banks, or bank groups). In some implementations, the CA bus 120 is used for transmitting addresses and commands from the memory controller 118 to the memory device 110, which transmitting may be to the exclusion of propagating data. The DQ bus 122 can propagate data between the memory controller 118 and the memory device 110. The memory device 110 may include or be configured with multiple memory banks (not shown in FIG. 1). The memory device 110 may be realized with any suitable memory and/or storage facility including, but not limited to: Dynamic Random-Access Memory (DRAM), Synchronous DRAM (SDRAM), three-dimensional (3D) stacked DRAM, Double Data Rate (DDR) memory, or Low-Power DDR (LPDDR) memory, including LPDDR DRAM and LPDDR SDRAM.

The memory device 110 may be described in terms of forming at least part of a main memory of the apparatus 102. The memory device 110 may, however, form at least part of a cache memory, a storage memory, an SoC, and so forth of an apparatus 102. An apparatus 102 may also include multiple memory devices 110. As illustrated in FIG. 1, the memory device 110 can include automated error correction (AEC) circuitry 112, which may include an ECC engine (not shown in FIG. 1).

The AEC circuitry 112, or an ECC engine thereof, can be realized as hardware (e.g., logic) that implements an ECC algorithm or another error detection or correction mechanism. In some implementations, an ECC engine can perform single-bit or multibit ECC determinations, such as 1-bit, 2-bit, or 3-bit ECC determinations. The hardware or logic of the ECC engine may implement, for example, a double error correction (DEC) Bose-Chaudhuri-Hocquenghem (BCH) code, a double-error-correcting and triple-error-detecting (DEC-TED) BCH code, and so forth. Other error correcting algorithms and mechanisms are described below.

As described herein, the AEC circuitry 112 can implement automated error correction with memory refresh. Accordingly, the AEC circuitry 112 can perform error correction on data that is being returned to the host device 104 via the interconnect 106 in response to a read command received from the memory controller 118. Further, the AEC circuitry 112 can perform error correction on data that is stored in a memory array in conjunction with a refresh operation. In some cases, an error address, or an address of corrupted data, is determined as part of a read operation. In other cases, an error address can be performed as part of a refresh operation on a memory array. An example memory device 110 having a memory array and AEC circuitry 112 is described next as part of a computing system with reference to FIG. 2.

Figure 2:
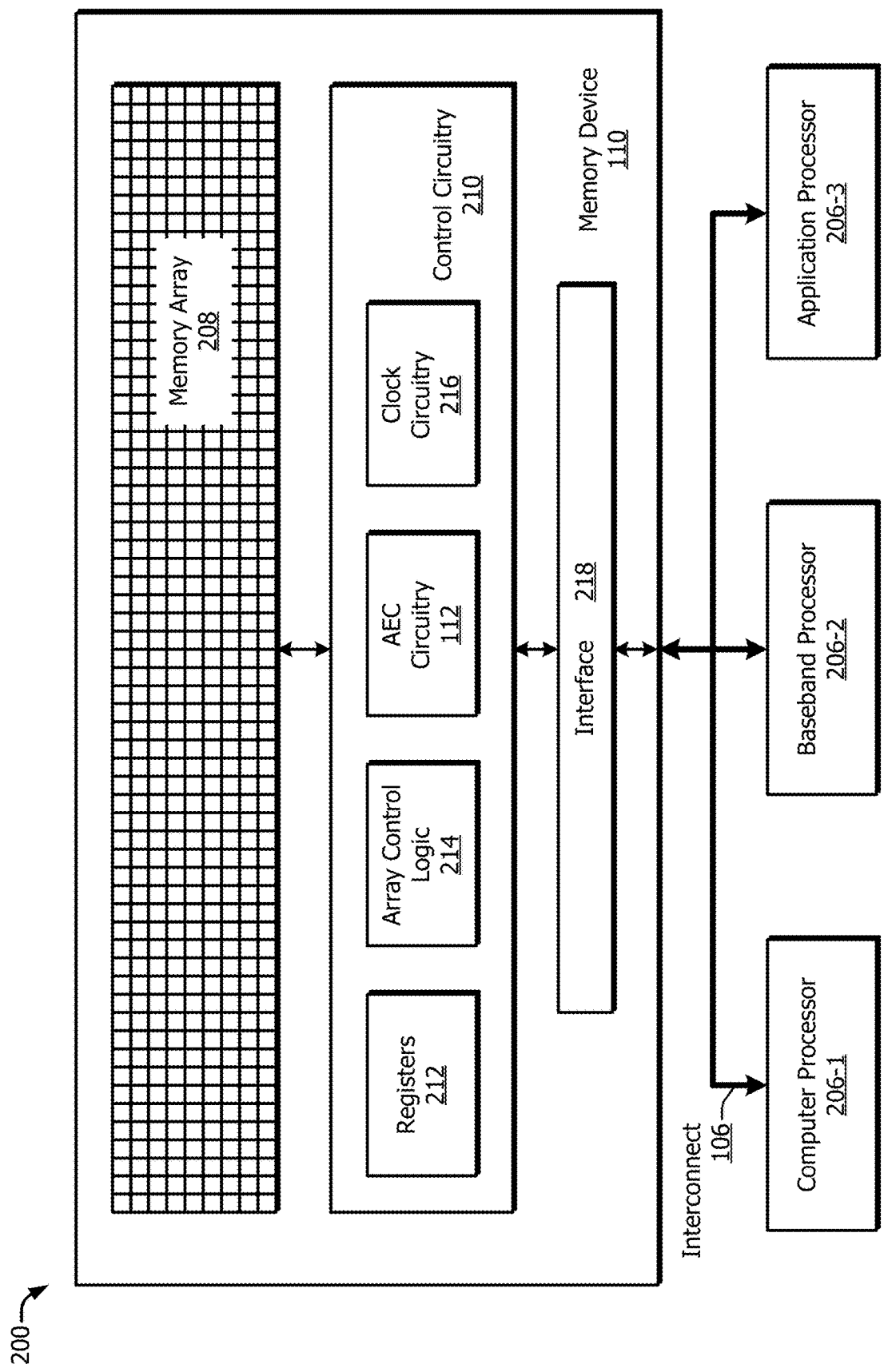
FIG. 2 illustrates example computing systems that can implement aspects of automated error correction with memory refresh with a memory device.

FIG. 2 illustrates an example computing system 200 that can implement aspects of automated error correction with memory refresh. In some implementations, the computing system 200 includes at least one memory device 110, at least one interconnect 106, and at least one processor 206. The memory device 110 can include, or be associated with, at least one memory array 208, at least one interface 218, and control circuitry 210 that is communicatively coupled to the memory array 208. The memory device 110 can correspond to one or more of the cache memory 108 or 116, the main memory, or a storage memory of the apparatus 102 of FIG. 1. Thus, the memory array 208 can include an array of multiple memory cells, including but not limited to memory cells of Dynamic Random-Access Memory (DRAM), Synchronous DRAM (SDRAM), three-dimensional (3D) stacked DRAM, Double Data Rate (DDR) memory, low-power Dynamic Random-Access Memory (DRAM), or Low-Power Double Data Rate (LPDDR) Synchronous Dynamic Random-Access Memory (SDRAM). The memory array 208 and the control circuitry 210 may be components on a single semiconductor die or on separate semiconductor dies. The memory array 208 or the control circuitry 210 may also be distributed across multiple dies.

The control circuitry 210 can include any of a number of components that are useable by the memory device 110 to perform various operations. These operations can include communicating with other devices, managing performance, performing memory read or write operations, refreshing memory cells, correcting data, and so forth. For example, the control circuitry 210 can include one or more registers 212, at least one instance of array control logic 214, clock circuitry 216, and the AEC circuitry 112. The registers 212 may be implemented, for example, as one or more registers that can store information to be used by the control circuitry 210 or another part of the memory device 110. The array control logic 214 may be implemented as circuitry that can provide command decoding, address decoding, input/output functions, amplification circuitry, power supply management, power control modes, refresh operations, and other functions. The clock circuitry 216 may be implemented as circuitry that can provide synchronization of various components of the memory device 110 with one or more external clock signals that may be provided over the interconnect 106, such as a command/address clock (e.g., CK_t or CK_c) or a data clock (e.g., WCK_t or WCK_c), and/or with at least one clock signal that is generated internally.

The interface 218 can couple the control circuitry 210 or the memory array 208 directly or indirectly to the interconnect 106. As shown in FIG. 2, the registers 212, the array control logic 214, the AEC circuitry 112, and the clock circuitry 216 can be part of a single component (e.g., the control circuitry 210). In other implementations, one or more of the registers 212, the array control logic 214, the AEC circuitry 112, or the clock circuitry 216 may be implemented as separate components, which can be provided on a single semiconductor die or disposed across multiple semiconductor dies. These components of the control circuitry 210 may be individually or jointly coupled to the interconnect 106 via the interface 218.

The interconnect 106 may be implemented with any one or more of a variety of interconnects that communicatively couple together various components and enable commands, addresses, and/or other information and data to be transferred between two or more of the various components (e.g., between the memory device 110 and the one or more processors 206). Although the interconnect 106 is represented with a single arrow in FIG. 2, the interconnect 106 may include at least one bus, at least one switching fabric, one or more wires or traces that carry voltage or current signals, at least one switch, one or more buffers, and so forth. Further, the interconnect 106 may be separated into at least a command-and-address (CA) bus 120 and a data (DQ) bus 122 (as depicted in FIG. 1).

In some aspects, the memory device 110 may be realized as a "separate" physical component relative to the host device 104 (of FIG. 1) or any of the processors 206. Examples of physical components that may be separate include, but are not limited to, a printed circuit board (PCB), which can be rigid or flexible; a memory card; a memory stick; and a memory module, including a single in-line memory module (SIMM) or a dual in-line memory module (DIMM). Thus, separate physical components may be located together within a same housing of an electronic device or may be distributed over a server rack, a data center, and so forth. Alternatively, the memory device 110 may be packaged or integrated with other physical components, including a host device 104 or a processor 206, such as by being combined on a common PCB or together in a single device package or by being integrated into an SoC.

The apparatuses and methods that are described herein may be appropriate for memory that is designed for lower-power operations or that is targeted for energy-efficient applications. Thus, the described principles may be incorporated into a low-power memory device. An example of a memory standard that relates to low-power applications is the Low-Power Double Data Rate (LPDDR) standard for synchronous DRAM (SDRAM) as promulgated by the Joint Electron Device Engineering Council (JEDEC) Solid State Technology Association. Some terminology in this document may draw from one or more of these standards or versions thereof, like the LPDDR5 standard, for clarity. The described principles, however, are also applicable to memories that comport with other standards, including other LPDDR standards (e.g., earlier versions or future versions like LPDDR6), and to memories that do not adhere to a public standard.

As shown in FIG. 2, the one or more processors 206 may include a computer processor 206-1, a baseband processor 206-2, and an application processor 206-3, which are coupled to the memory device 110 through the interconnect 106. The processors 206 may each be, or may form a part of, a CPU, a GPU, an SoC, an ASIC, an FPGA, or the like. In some cases, a single processor can comprise multiple processing resources, each dedicated to different functions, such as modem management, applications, graphics, central processing, or the like. In some implementations, the baseband processor 206-2 may include or be coupled to a modem (not separately shown in FIG. 2) and may be referred to as a modem processor. The modem and/or the baseband processor 206-2 may be coupled wirelessly to a network via, for example, cellular, Wi-Fi®, Bluetooth®, near field, or another technology or protocol for wireless communication.

In some implementations, the processors 206 may be connected directly to the memory device 110 (e.g., via the interconnect 106 as shown). In other implementations, one or more of the processors 206 may be indirectly connected to the memory device 110 (e.g., over a network connection or through one or more other devices). Further, each processor 206 may be realized similarly to the processor 114 of FIG. 1. Accordingly, a respective processor 206 can include or be associated with a respective memory controller, like the memory controller 118 depicted in FIG. 1. Alternatively, two or more processors 206 may access the memory device 110 using a shared or system memory controller 118 (not explicitly shown).

The AEC circuitry 112 can provide automated error correction functionality with memory refresh operations for data stored in the memory array 208. The AEC circuitry 112 can, for instance, determine an error address and corrected data for read data that is obtained in response to a read command from a processor 206. During a subsequent refresh operation for a refresh address that matches the error address, the AEC circuitry 112 can insert the corrected data into the memory array 208. The corrected data can be stored with the error address based on the processing of the read operation or can be recomputed for the refresh operation. Example operations for the AEC circuitry 112 are described below.

Example Schemes and Process Flows

Figure 3:
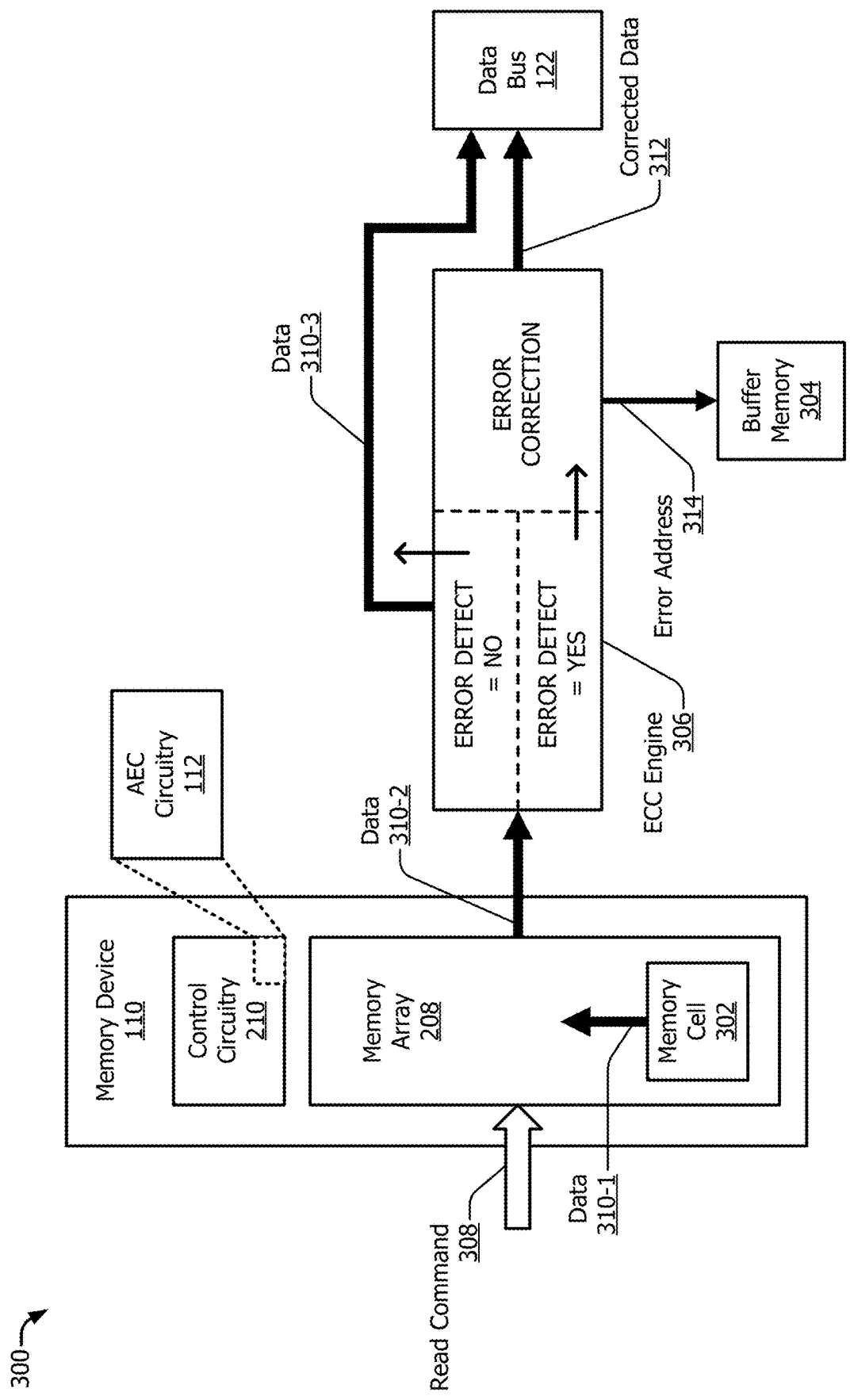
FIGS. 3 and 4 illustrate example process flows depicting aspects of automated error correction with memory refresh.
Figure 4:
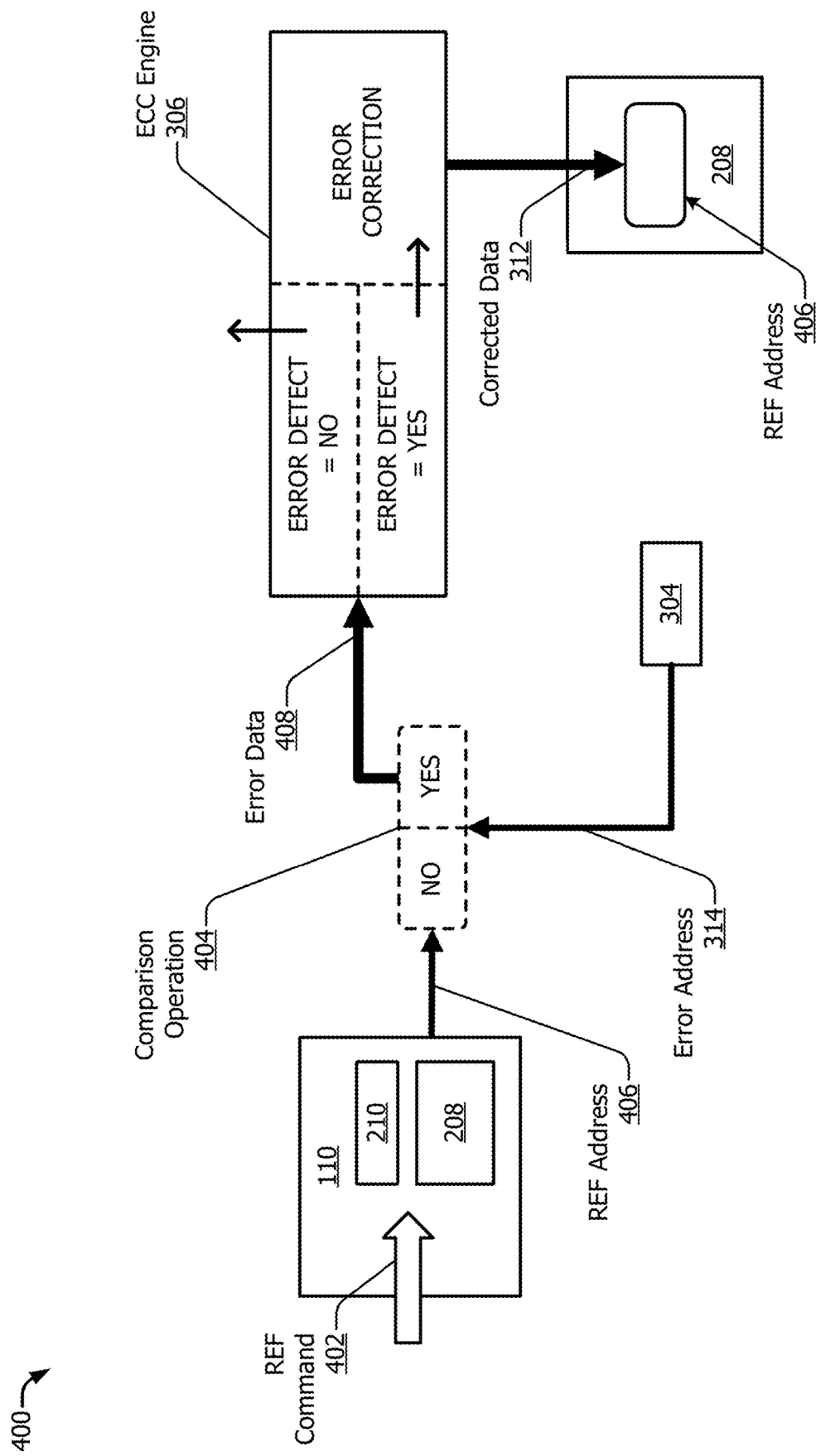

FIGS. 3 and 4 depict example process flows for automated error correction with memory refresh. The process flow 300 of FIG. 3 relates to detecting and correcting corrupted data and to noting an error address in association with performing a read operation. The process flow 400 of FIG. 4 relates to replacing corrupted data in a memory array with corrected data in conjunction with performing a refresh operation on the data array. These process flows are described in terms of ECC algorithms, but other correction techniques may be used instead.

FIG. 3 depicts a process flow 300 for automated error correction with memory refresh for a memory device 110. Example details of the process flow 300 are described with reference to the example memory device 110, but such details are applicable to other DRAM memory devices. As illustrated for certain implementations, the memory device 110 can include at least one memory array 208 and control circuitry 210. The memory array 208 can include one or more memory banks (not shown), each of which has at least one memory cell 302. The memory device 110 can also include at least one buffer memory 304 and at least one ECC engine 306 or other error correction engine. The buffer memory 304 can include an array of memory storage locations and can be part of or separate from the control circuitry 210 or the AEC circuitry 112 thereof. Similarly, the ECC engine 306 can be part of or separate from the control circuitry 210 or the AEC circuitry 112 thereof.

As shown in the process flow 300, the memory device 110 receives from a host device 104 (of FIG. 1) a read command 308 that includes a memory address. The memory address corresponds to a memory cell 302 that contains data 310. Under the control of the control circuitry 210 (e.g., the array control logic 214 thereof), the memory device 110 reads data 310-1 from the memory cell 302 that corresponds to the memory address indicated in the read command 308. The control circuitry 210 provides the data to the ECC engine 306 as indicated by data 310-2.

The ECC engine 306 performs an ECC operation on the data 310-2 to check for errors. If the ECC engine 306 detects no errors, the data 310-3 is transmitted to the data bus 122 as depicted in the "upper" data path. On the other hand, if the ECC engine 306 detects an error (e.g., a correctable error), the ECC engine 306 corrects the data 310-2 using, for example, one of the techniques described above (e.g., an ECC1, ECC2, or ECC3-based algorithm). The AEC circuitry 112 transmits corrected data 312 to the data bus 122. The AEC circuitry 112 stores or writes an error address 314 to the buffer memory 304. Here, the error address 314 corresponds to the memory address of the memory cell 302 having data 310-1 that includes the bit error. The error address 314 may also include a portion of the memory address but less than all of (e.g., but less than the entirety of) the memory address (e.g., if part of the memory address is implicit in the location of the memory array 208 or the AEC circuitry 112 or is located on a different die).

In some implementations, the AEC circuitry 112 of the control circuitry 210 causes the corrected data 312 to be stored in the memory cell 302 responsive to the error detection by the ECC engine 306 and in conjunction with driving the corrected data 312 onto the data bus 122. This approach frees the refresh process from performing the data correction update; however, this approach may involve an additional activation, pre-charging, or read-modify-write operation that is not otherwise used. In contrast, the example process flow described with reference to FIG. 4 can merges the data correction with a refresh operation.

FIG. 4 depicts a process flow 400 for automated error correction with memory refresh for a memory device 110 that is undergoing a refresh operation. Although the example details of the process flow 400 are described with reference to the memory device 110, such details are applicable to other DRAM memory devices. As shown in the process flow 400, the memory device 110 is engaging in a refresh (REF) operation responsive to a refresh (REF) command 402. The memory device 110 may initiate an auto-refresh operation in response to receiving an auto-refresh command or a self-refresh operation in response to receiving a self-refresh entry (SRE) command. While in a self-refresh mode, the memory device 110 can refresh a set of memory cells of the memory array 208 according to an internal timer.

Thus, a refresh operation can be an auto-refresh operation or a self-refresh operation. During a refresh operation, the memory device 110 performs a comparison operation 404 between the addresses 406 of the memory cells to be refreshed (refresh or REF addresses 406) and the error address 314. If the AEC circuitry 112 of the memory device 110 determines, based on the comparison operation 404, that the refresh address 406 matches the error address 314, then the AEC circuitry 112 has reached a refresh address 406 for data that includes one or more error bits. The AEC circuitry 112 can correct the error as part of refreshing a memory cell corresponding to the refresh address 406 that matches the error address 314.

In some implementations, the AEC circuitry 112 can correct the error using the ECC engine 306. For example, as shown in the example process flow 400, the AEC circuitry 112 can provide error data 408 to the ECC engine 306. The error data 408 includes the data stored in the memory cell corresponding to the refresh address 406 that matches the error address 314. The ECC engine 306 can compute the corrected data 312 based on the error data 408 and an associated ECC value. The AEC circuitry 112 can provide the corrected data 312 to the control circuitry 220 (e.g., refresh control circuitry) for writing the corrected data 312 to the refresh address 406 that matches the error address 314. In some cases, after the corrected data 312 is written to the memory array 208 at a location corresponding to the refresh address 406, the memory device 110 can continue performing the refresh operation on the memory array 208.

In other implementations (not explicitly shown in FIG. 4), the memory device 110 can correct the data stored in the memory location corresponding to the refresh address 406 that matches the error address 314 without recomputing the corrected data 312. The control circuitry 210 can use, for instance, a read-modify-write operation that is performed as part of the refresh operation. In this case, the ECC engine 306 can store the determined corrected data 312 in the buffer memory 304 (e.g., in a latch circuit thereof) in association with the error address 314 responsive to an error detection during a read operation (e.g., as described above for the process flow 300). During a subsequent refresh operation, the AEC circuitry 112 can retrieve the corrected data 312 from the buffer memory 304 instead of directing the ECC engine 306 to recompute the corrected data 312 using an ECC value. In these implementations, the error address 314 and the corrected data 312 may be co-located during storage or stored separately until a refresh operation.

As described with reference to FIGS. 3 and 4, the ECC engine 306 can be used for error correction with read operations and refresh operations. In some implementations, the memory device 110 can include multiple ECC engines. For example, a 1-bit ECC engine and a multibit ECC engine may both be used. The 1-bit ECC engine can be used for correcting errors during read operations because the 1-bit ECC engine generally provides faster computation times for error correction and detection, which preserves system performance by not increasing latency. The multibit ECC engine, on the other hand, can be used for data correction during refresh operations because there is no data to output, so a slower error computation time may not adversely affect output latency or other performance measures. Employing multibit ECC techniques, which may be more robust than 1-bit ECC algorithms, during refresh operations can thereby increase longer-term reliability.

In some implementations, the described error-correction operations on the data of the memory array 208 may be performed during or responsive to read operations, rather than waiting for a refresh command. Thus, automated error correction with memory refresh can be applied in conjunction with one or more self-refresh operations or one or more auto-refresh operations, which are initiated under the command of the host device 104, and the corrections can be performed at the memory array 208 to correct corrupted data in memory cells thereof.

Example Techniques and Hardware

Figure 5:
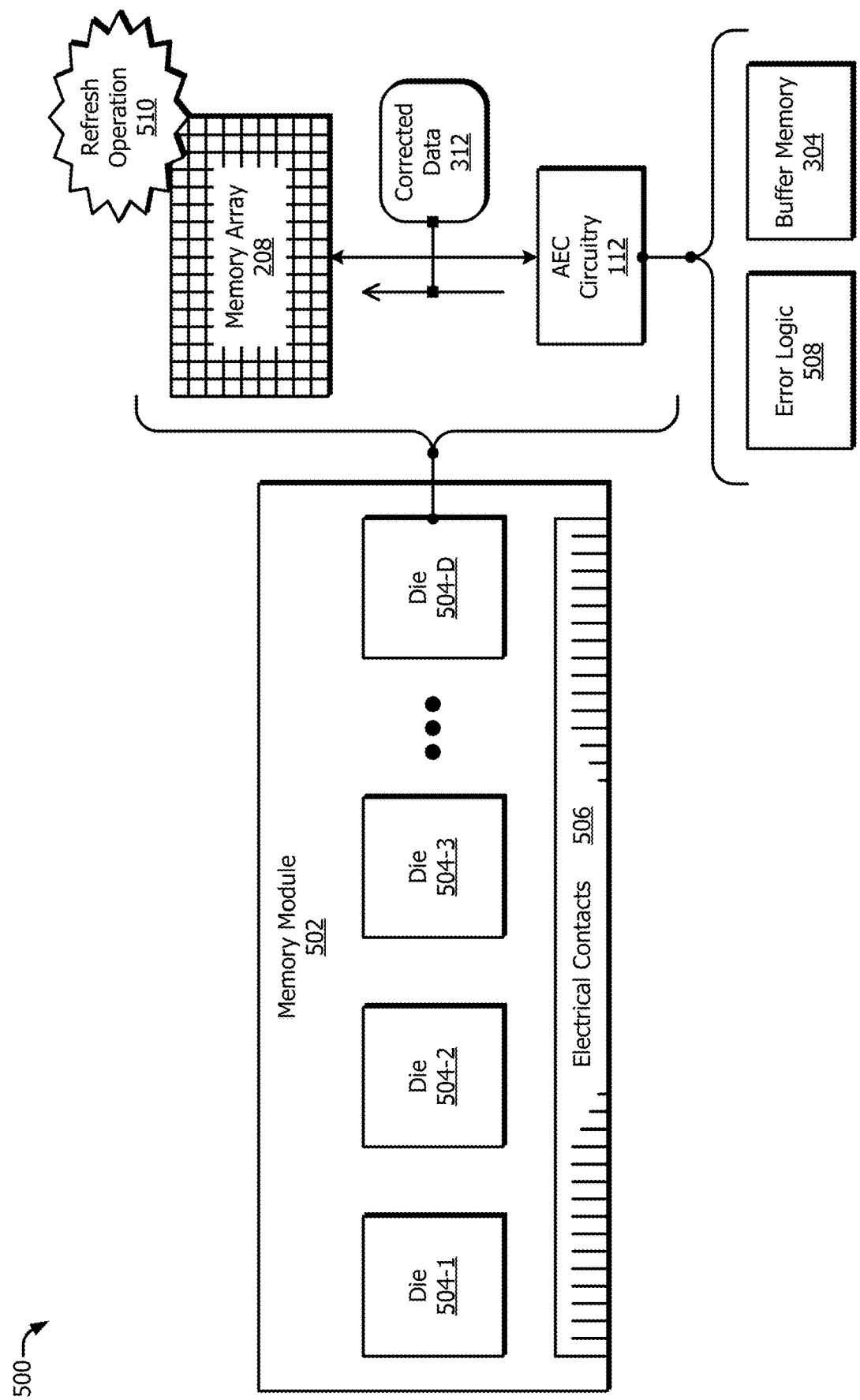
FIG. 5 illustrates memory device examples such as a die that can implement automated error correction with memory refresh to store corrected data in a memory array.

FIG. 5 illustrates memory device examples at 500. An example memory module 502 includes multiple dies 504—e.g., multiple memory dies 504. As depicted, the memory module 502 includes a first die 504-1, a second die 504-2, a third die 504-3, . . . , and a $D^{th}$ die 504-D, with "D" representing a positive integer. The memory module 502 can be realized as a SIMM or a DIMM, just to name a couple of examples. A memory device 110 can correspond, for example, to a single die 504, multiple dies 504-1 . . . 504-D, a memory module 502 with at least one die 504, and so forth. As shown, the memory module 502 can include one or more electrical contacts 506 (e.g., pins) to interface the memory module 502 to other components, such as the interconnect 106 of FIGS. 1 and 2.

The memory module 502 can be implemented in various manners. For example, the memory module 502 may include a PCB, and the multiple dies 504-1 . . . 504-D may be mounted or otherwise disposed on the PCB. The dies 504 (e.g., memory dies) may be arranged in a line or along two or more dimensions (e.g., like in a grid or array). The dies 504 may have a common size or may have different sizes.

Each die 504 may be like one or more other dies 504 or may be unique on a given memory module 502 in terms of size, shape, data capacity, control circuitries, and so forth. Dies 504 may also be distributed on multiple sides of the memory module 502.

In example implementations, each die 504 can include multiple components. Example components include AEC circuitry 112 and at least one memory array 208. The AEC circuitry 112 can include, for example, error logic 508 and at least one buffer memory 304. The error logic 508 can control, at least partly, the automated error correction with memory refresh functionality as described herein. The error logic 508 can be realized using, for example, error correction code (ECC) circuitry. Thus, the error logic 508 may include at least one error correction engine, such as the ECC engine 306 of FIGS. 3 and 4.

During a refresh operation 510 of at least part of the memory array 208, the error logic 508 causes corrected data 312 to replace corrupted data. The data replacement can be performed as part of a refresh of a memory portion (e.g., a memory row) that includes an address of the corrupted data to increase efficiency of the data replacement. Accordingly, the AEC circuitry 112 can interact or cooperate with refresh control circuitry. Examples of refresh control circuitry are described below with reference to FIG. 6.

Figure 6:
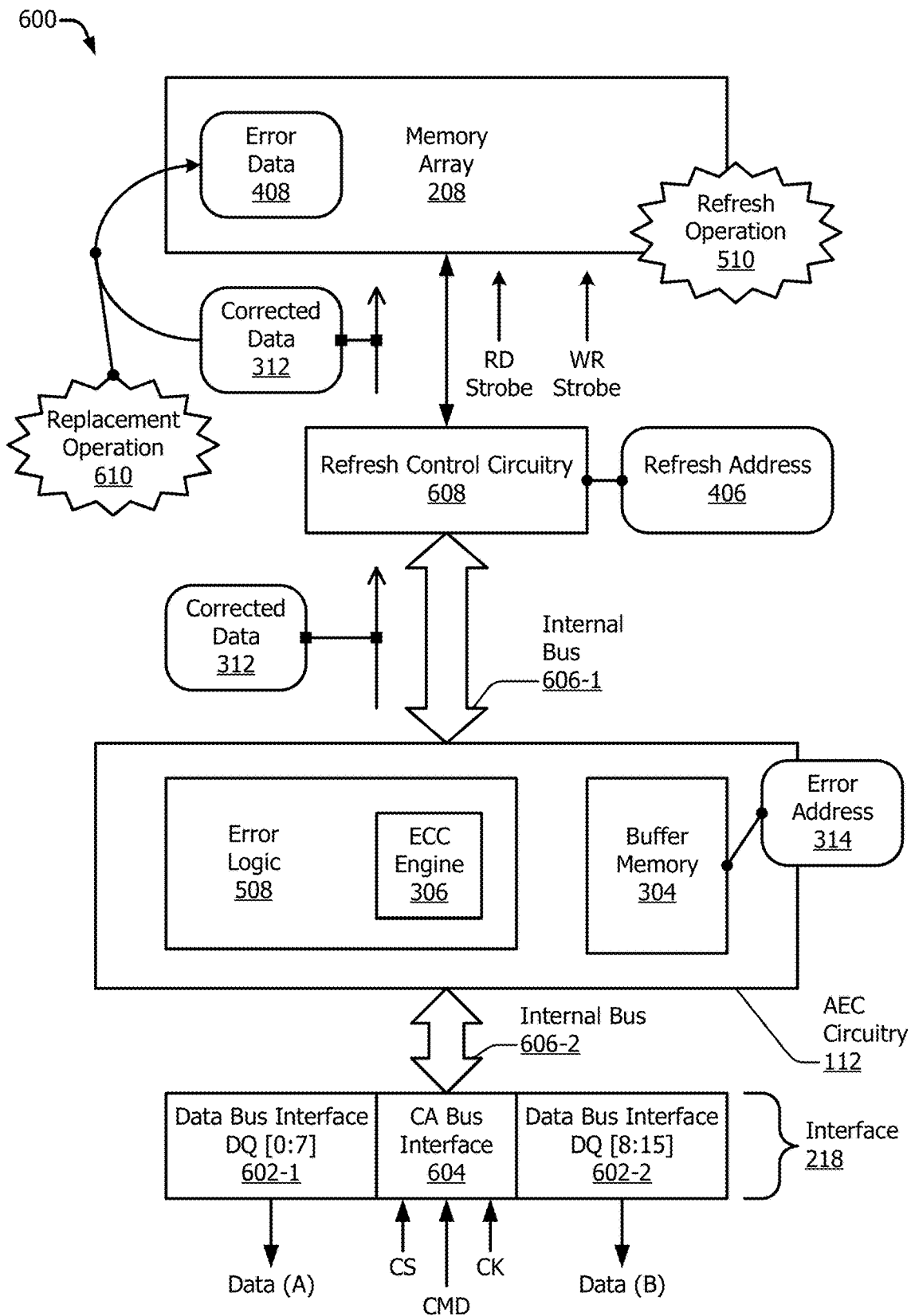
FIG. 6 illustrates example architectures for a memory device that includes automated error correction (AEC) circuitry and refresh control circuitry for automated error correction with memory refresh.

FIG. 6 illustrates example architectures 600 for a memory device that includes AEC circuitry 112, refresh control circuitry 608, and at least one memory array 208 on a memory die. Although not explicitly shown, the memory array 208 can include multiple memory banks (e.g., two or more memory banks). The control circuitry 210 (e.g., of FIG. 2), such as the array control logic 214 thereof, can access the memory array 208 using, for example, a read strobe (RD Strobe) or a write strobe (WR Strobe). The AEC circuitry 112 can include error logic 508 and at least one buffer memory 304. The error logic 508 can include at least one error correction engine, such as the ECC engine 306, that performs an error correction process (e.g., an automated error correction process) for data stored in the memory array 208.

Although the AEC circuitry 112 is depicted as one block, the circuitry, logic, memories, etc. thereof may be distributed over the memory die. For example, the ECC engine 306 may be disposed relatively closer to the memory array 208. The ECC engine 306 may, for instance, be disposed in a periphery of, or under, the memory array 208. In some cases, the ECC engine 306 is realized using complementary metal-oxide-semiconductor (CMOS) technology. Further, a given memory die may include multiple ECC engines 306. One ECC engine 306 can operate on data read out for a read command, and another ECC engine 306 can operate on data sensed as part of a refresh operation 510. A memory die may include a single ECC engine 306 for the memory array 208, an ECC engine 306 per memory bank of multiple memory banks, an ECC engine 306 per pair of memory banks, and so forth.

The memory die (or a memory module) of the architectures 600 can also include multiple interfaces that may form part of the interface 218. These multiple interfaces can include a first data bus interface 602-1 for a lower byte of data-including or corresponding to the DQ pins [0:7]—and a second data bus interface 602-2 for an upper byte of data-including or corresponding to the DQ pins [8:15]. The first and second data bus interfaces 602-1 and 602-2 can interface with the data (DQ) bus 122 (e.g., of FIGS. 1 and 3) and output Data (A) and Data (B), respectively. These multiple interfaces of the die 504 can also include a command and address (CA) bus interface 604 to interface with the command and address (CA) bus 120 (of FIG. 1). The CA bus interface 604 can receive chip select (CS), clock (CK), command (CMD), and other signaling. Alternatively, the die 504 may also include a chip-select (CS) interface (not shown). The inputs and outputs of the data bus interface 602 and the CA bus interface 604 are described below with reference to the timing diagrams of FIGS. 7-1 to 8-2.

The architecture 500 can also include ECC logic as indicated by the ECC engine 306 of the error logic 508 of the AEC circuitry 112. The error logic 508 can be realized with hardware that implements at least one single-bit or multibit ECC scheme, such as with a 1-bit, a 2-bit, or a 3-bit ECC engine (an ECC1, ECC2, or ECC3 engine). Generally, the ECC engine 306 can be implemented as an N-bit ECC engine in which "N" is a positive integer. The ECC engine 306 can use any ECC algorithm or combination of multiple ECC algorithms to compute an ECC value relative to a unit of data. Examples of ECC algorithms include those relating to block codes, such as Hamming codes, Reed-Solomon codes, Golay codes, Bose-Chaudhuri-Hocquenghem (BCH) codes, multidimensional codes, other ECC coding schemes described herein, and the like. However, the ECC engine 306 can employ one or more alternative ECC algorithms for block codes or employ an alternative coding scheme.

In example implementations, the interface 218 is coupled to the memory array 208 and the AEC circuitry 112. More specifically, the AEC circuitry 112 can be coupled between the interface 218 and the memory array 208, at least with respect to AEC functions. The coupling of components on a die can be realized with one or more internal buses 606. As shown by way of example, a first internal bus 606-1 couples the AEC circuitry 112 to the memory array 208, and a second internal bus 606-2 couples the AEC circuitry 112 to the interface 218. An architecture 600 may, however, have fewer, more, or different internal buses 606. For example, an internal bus (not shown) may couple the interface 218 "directly" to the memory array 208, thereby bypassing one or more other components (e.g., the AEC circuitry 112). The refresh control circuitry 608 may be coupled to the memory array 208 by another internal bus. Generally, each internal bus 606 may include one or more data paths. A data path may include one or more wires or sets of wires to propagate voltages, currents, and so forth.

The refresh control circuitry 608 can form a part of the control circuitry 210 of a memory device 110. The refresh control circuitry 608 controls performance of one or more refresh operations 510. A refresh operation 510 may correspond to an auto-refresh operation, a self-refresh operation, and so forth. A refresh operation 510 may target one bank, multiple but not all banks, or all banks of the memory array 208. During a refresh operation 510, the refresh control circuitry 608 determines (e.g., increments or otherwise generates) multiple refresh addresses 406 to cover a targeted amount of memory. A current refresh address 406 represents a block of memory (e.g., a row of memory) that is currently being refreshed. An example of how automated error correction can be performed in conjunction with memory refresh is described below with reference to FIGS. 8-1 and 8-2.

FIGS. 7-1 to 8-2 depict example timing diagrams for automated error correction with memory refresh. A timing diagram 700 extends across FIGS. 7-1 and 7-2 and is directed to detecting and correcting an error in conjunction with a read operation. The timing diagram 700 also illustrates storing an error address 314 in the buffer memory 304. A timing diagram 800 extends across FIGS. 8-1 and 8-2 and is directed to correcting an error present in the memory array 208 in conjunction with a refresh operation 510. The timing diagram 800 also illustrates using the error address 314 stored in the buffer memory 304 to guide the replacement operation 610. The error logic 508 and the refresh control circuitry 608 can jointly replace the error data 408 with the corrected data 312 in the replacement operation 610 in conjunction with the refresh operation 510. This can occur, for instance, responsive to a row of memory, which includes the error data 408, being read from the memory array 208 into sense amps as part of the refresh operation 510 based on the current refresh address 406 matching at least part of the error address 314.

Figures 1, 7:
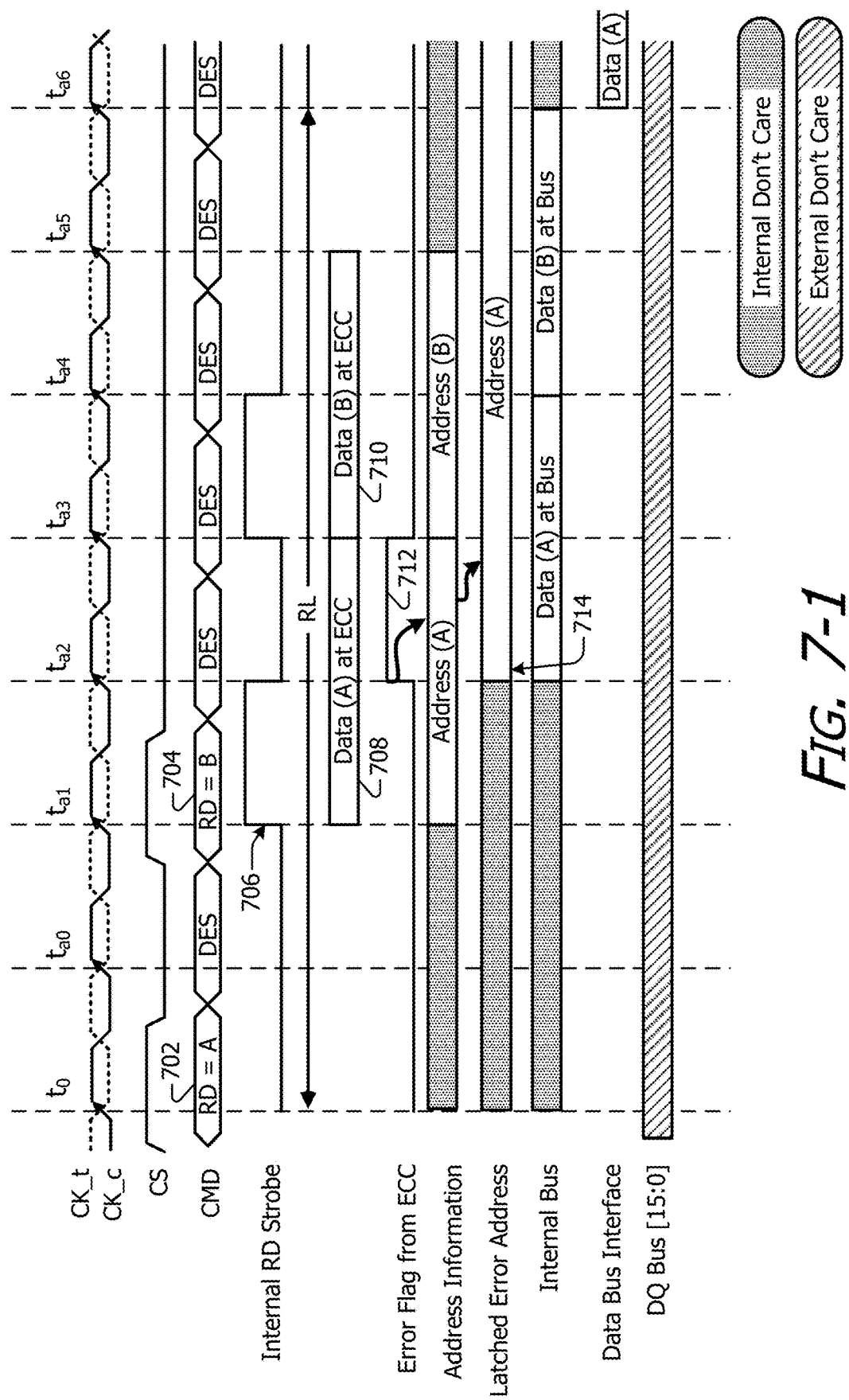
Figures 2, 7:
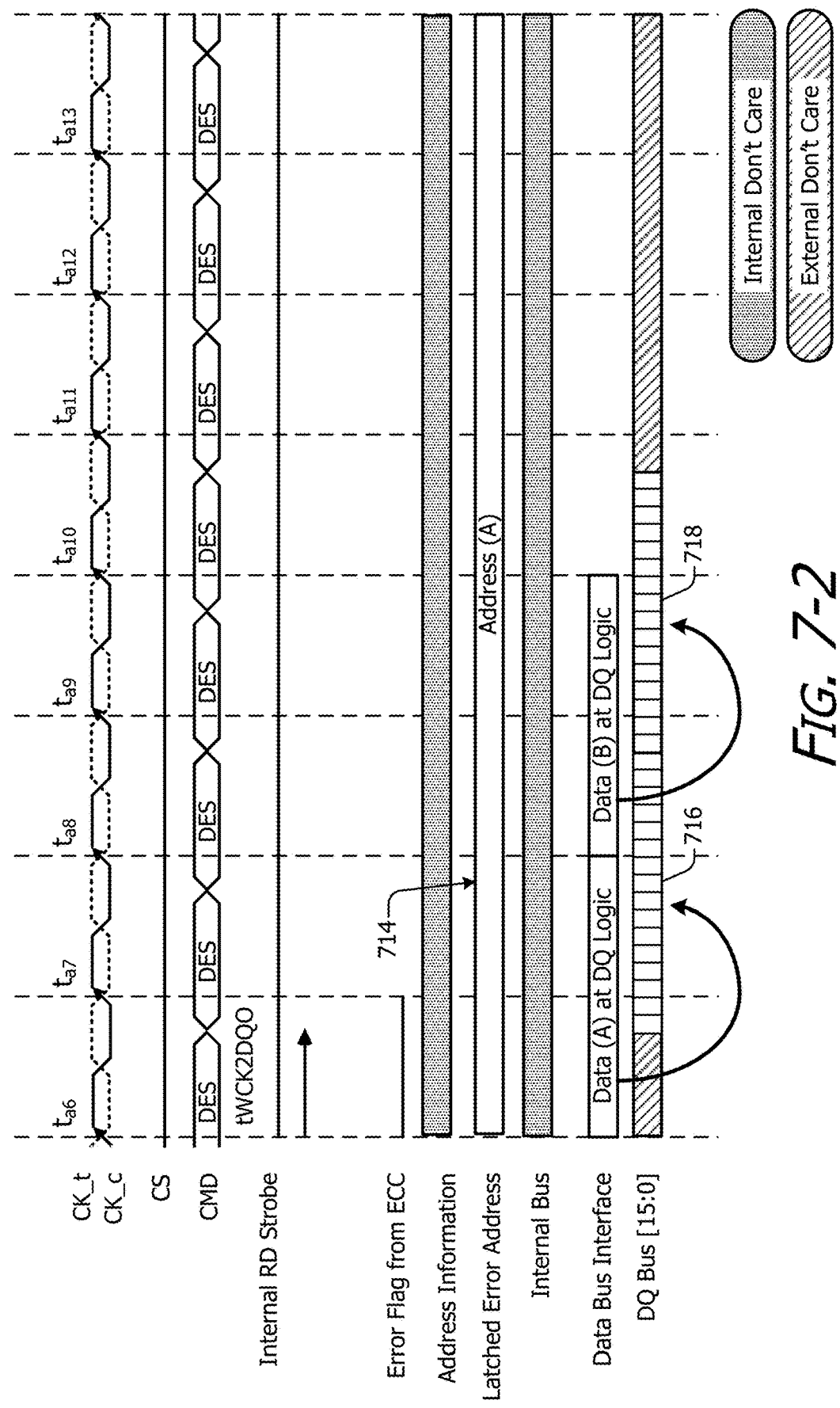

The descriptions of FIGS. 7-1 to 8-2 reference the hardware and techniques described above for other figures. Nonetheless, the timing diagrams 700 and 800 may be implemented with different hardware, techniques, schemes, and so forth. FIG. 7-1 depicts a "left" half 700-1 of the timing diagram 700. At 702, a first read command is received that includes an Address (A) and targets Data (A). At 704, a second read command is received that includes an Address (B) and targets Data (B). Responsive to two read strobes at 706, the control circuitry 210 reads out Data (A) at 708 and Data (B) at 710. The error logic 508, which may employ the ECC engine 306, performs error detection or correction on the Data (A) and the Data (B) using two respective error correction values (e.g., two ECC values).

As shown at 712, the Data (A) fails the error correction verification process. Thus, the integrity of the Data (A) fails, and the Data (A) includes at least one error. The error logic 508 generates an error flag. Responsive to the error flag for Data (A), the error logic 508 stores the corresponding Address (A) in the buffer memory 304 as error address 314 at 714. The Data (B), on the other hand, passes the data integrity test—e.g., a computed ECC value matches a stored ECC value. Accordingly, the Address (B) is not stored in the buffer memory 304.

Continuing with the "right" half 700-2 of the timing diagram 700, the Address (A) is retained in the buffer memory 304 as indicated at 716. The corrected data 312 is substituted for the corrupted or error data 408 for responding to the read command. At 716, the corrected data 312 is output on the data bus interface 602 as the Data (A) of the Address (A). For the Data (B) of the Address (B), the data as read from the memory array 208, which data is verified to be correct by the ECC engine 306, is forwarded to the data bus interface 602 without modification at 718.

Figures 1, 8:
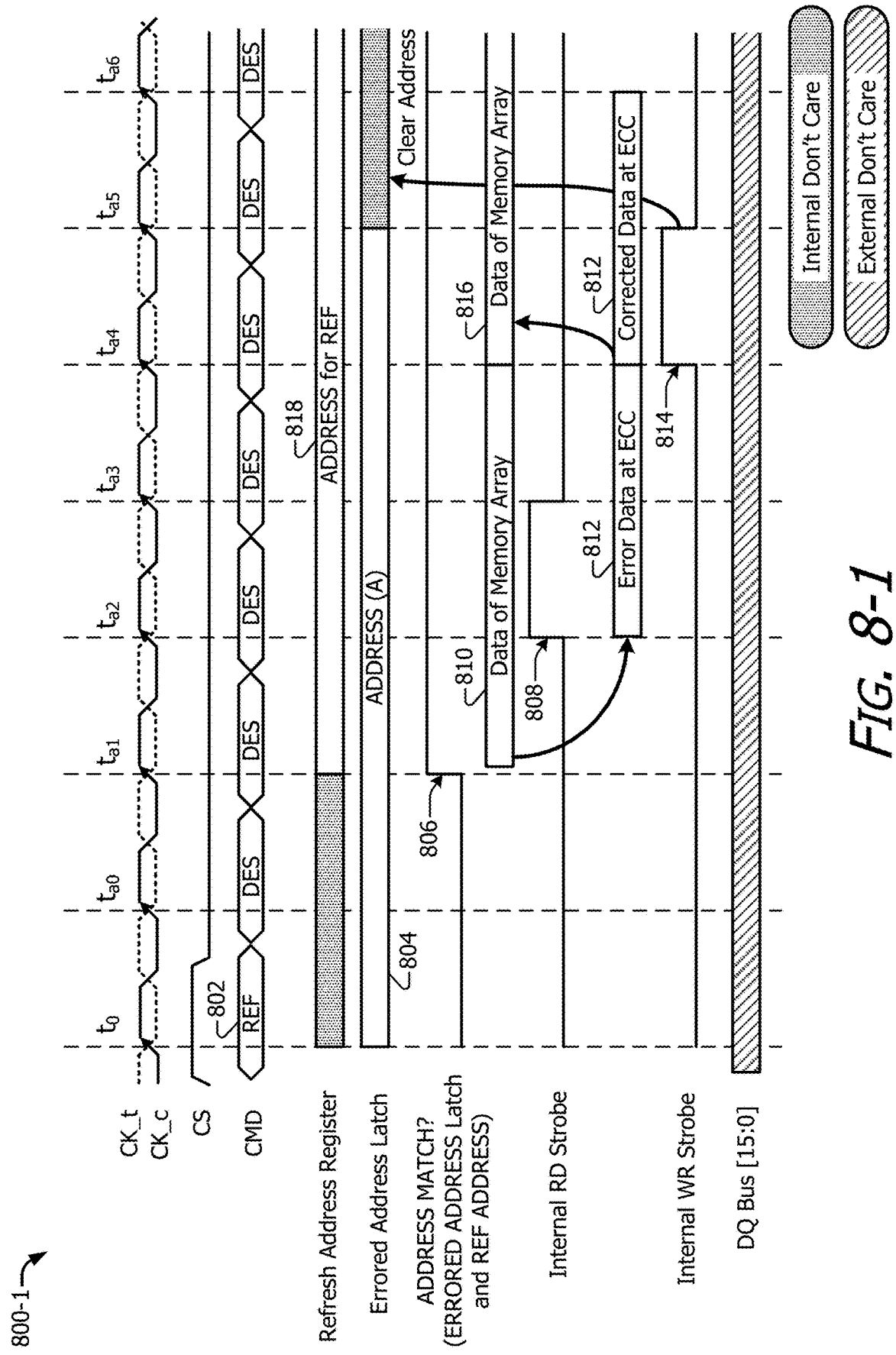
Figures 2, 8:
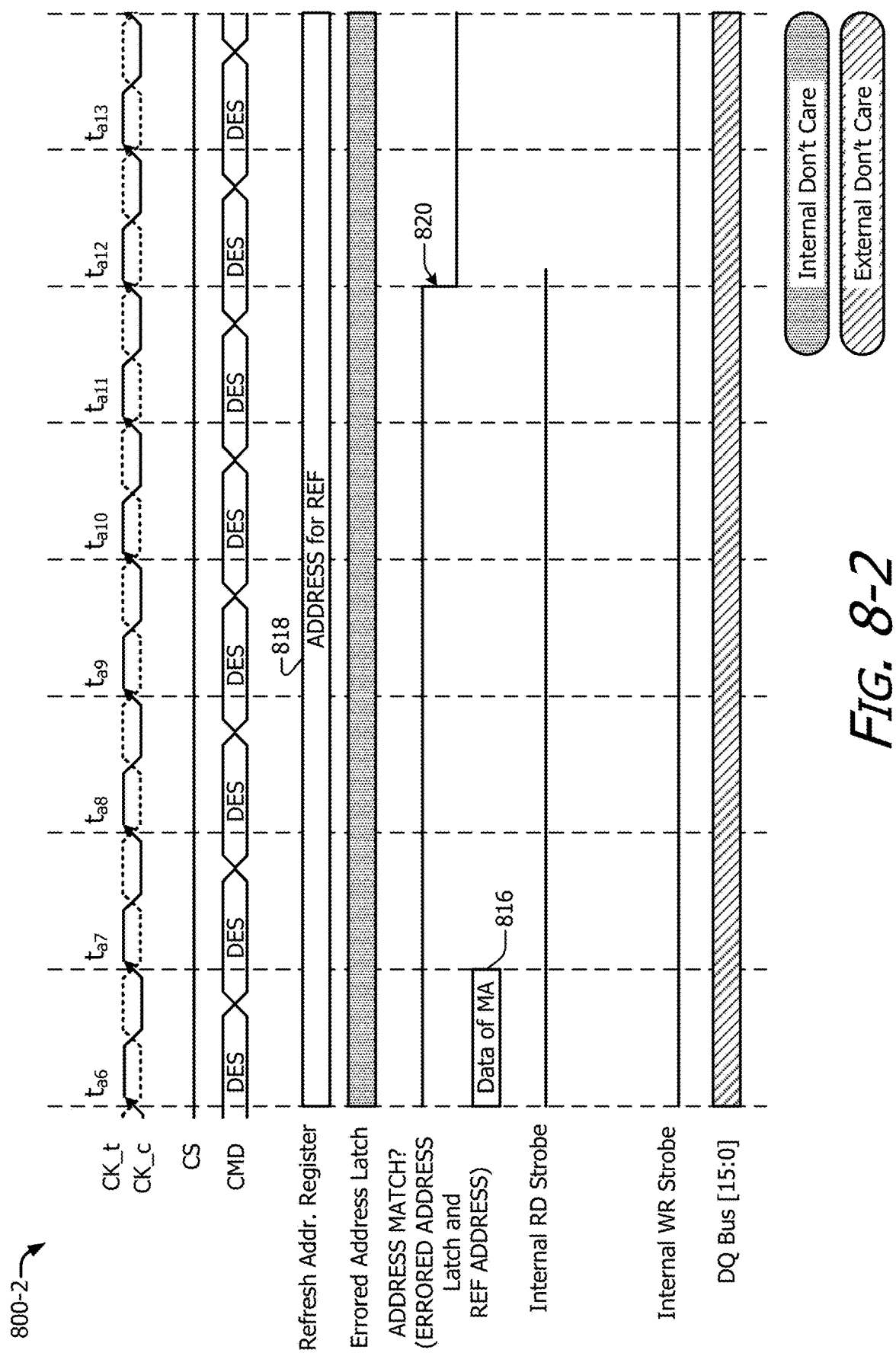

The flow diagram 800 of FIGS. 8-1 and 8-2 is described in terms of a self-refresh operation. The principles, however, are applicable to refresh operations generally. The memory device 110 or die or bank thereof enters a self-refresh mode at 802 in response to a self-refresh entry command (e.g., an SRE command). As indicated at 804, the Address (A) continues to be stored in the buffer memory 304. The refresh control circuitry 608 moves through refresh addresses 406 as part of the refresh operation 510 as indicated at 818. For each refresh address 406, the error logic 508 can compare the one or more error addresses 314 stored in the buffer memory 304 to the current refresh address 406. At 806, a match is determined between the refresh address 406 and the stored error address 314.

In conjunction with the match determination, the refresh control circuitry 608 issues a read strobe to include the refresh address 406 at 808. In response to the match determination, the error data 408 (for the Data (A)) that is read out as part of the refresh operation at 810 is corrected. The error logic 508 recomputes the corrected data 312 based on the error data 408 and an ECC value or retrieves the corrected data 312 from the buffer memory 304 at 812.

The refresh control circuitry 608 issues a write strobe at 814. In response to the write strobe, the refresh control circuitry 608 stores the corrected data 312 for the Data (A) in the memory array 208 at 816. Continuing with the "right" half 800-2 of the timing diagram 800, the address match indication signal goes low at 820 after the refresh address 406 is changed or the buffer memory 304 is cleared. Although the timing diagrams 700 and 800 depict example approaches, automated error correction with memory refresh may be implemented in alternative manners. For example, the detection of error data 408 may be made in response to sensing the data for one or more addresses that are being refreshed as part of a refresh operation instead of in response to a read command.

Example Methods

Figure 9:
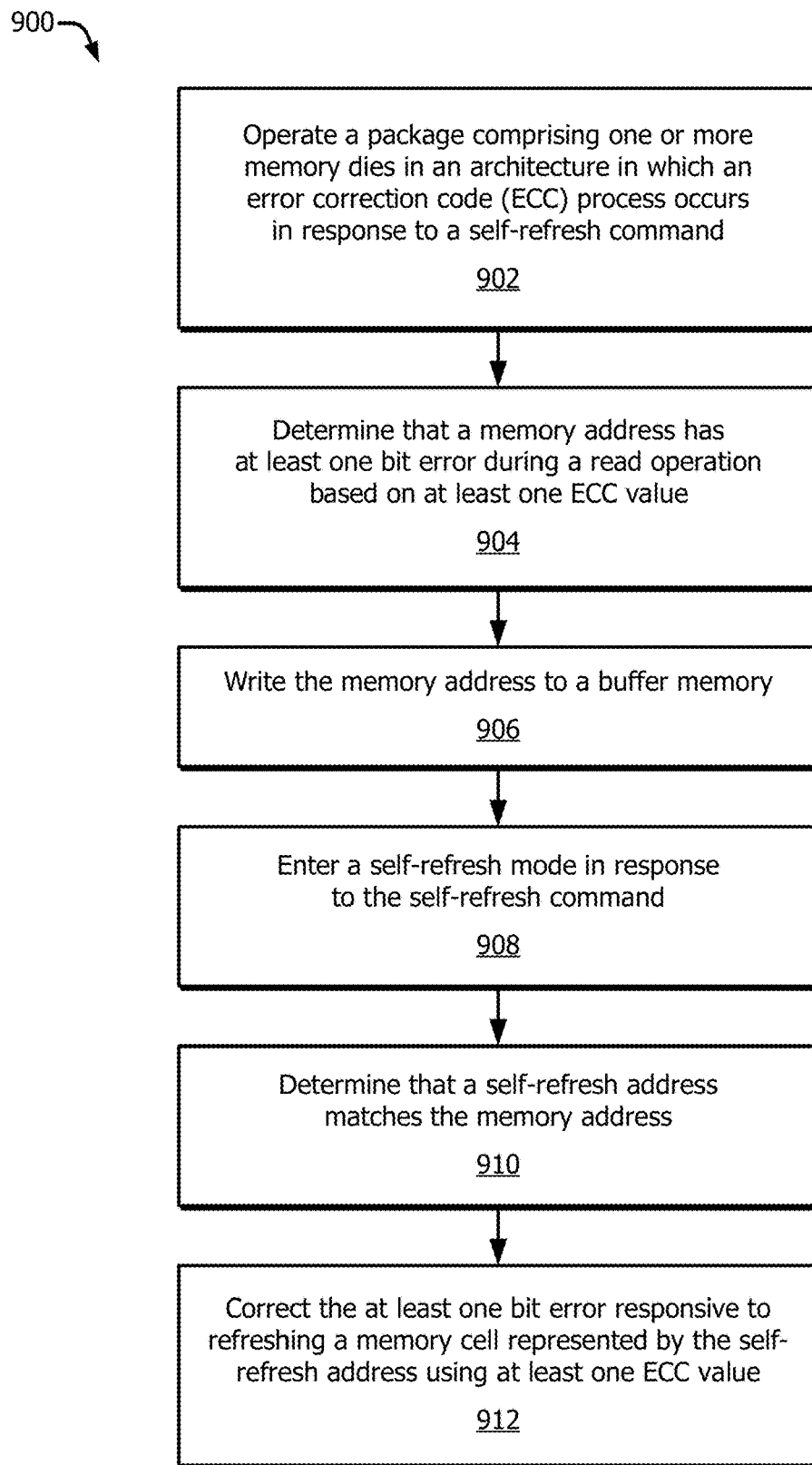
FIG. 9 illustrates a flow diagram for an example process that implements automated error correction with memory refresh.
Figure 10:
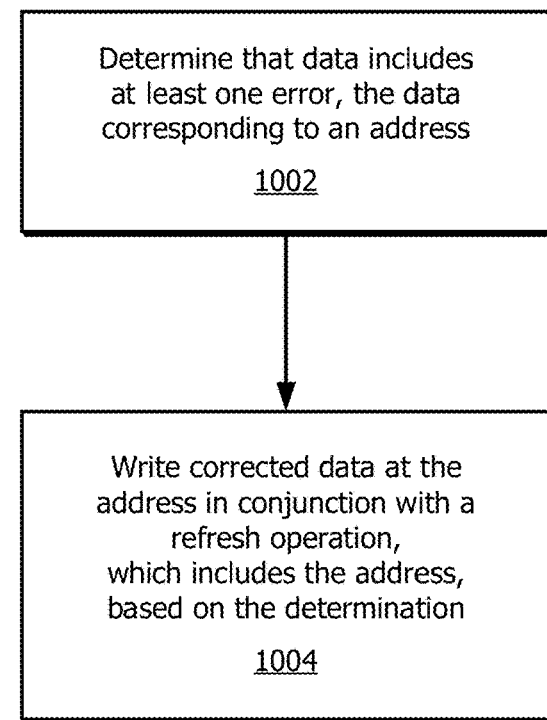
FIG. 10 illustrates a flow diagram for another example process that implements automated error correction with memory refresh.

This section describes example methods with reference to the flow chart(s) and flow diagram(s) of FIGS. 9 and 10 for implementing automated error correction with memory refresh. These descriptions may also refer to components, entities, and other aspects depicted in FIGS. 1 to 8-2, which reference is made only by way of example.

FIG. 3 depicts an example method 900 for an apparatus to implement automatic error correction with self-refresh. The following discussion may reference components or techniques described with reference to the example apparatus 100 or the example process flows of FIGS. 2-1 and 2-2, but such references are made only by way of example.

At block 902, a package comprising one or more memory dies is operated in an architecture in which an error correction code (ECC) process occurs in response to a self-refresh command (or other refresh command). For example, one or more memory dies 504 can form at least part of a memory device 110, as described with reference to FIGS. 1 and 2, and the architecture may include features described with reference to FIGS. 3 and 4 or the architectures 600 of FIG. 6. At block 904, the ECC process determines, during a read operation, that a memory address has at least one bit-error based on at least one ECC value. For example, error logic 508 can use an ECC engine 306 to determine that a bit error exists at a memory address requested to be read during a read operation.

At block 906, the ECC process uses automated circuitry to write the memory address to a buffer memory. For example, the error logic 508 can write the error address 314 to the at least one buffer memory 304. The error logic 508 may also write the corrected data 312 into the buffer memory 304 (or another memory). At block 908, the one or more memory dies enter a self-refresh mode in response to the self-refresh command. For example, at least one die 504 of the memory device 110 can enter the self-refresh mode in response to a self-refresh entry command received from a host device 104 or a memory controller 118.

At block 910, the one or more memory dies determine that a self-refresh address matches the memory address. For example, the error logic 508 can determine that a refresh address 406 matches at least part of an error address 314 stored in the buffer memory 304. At block 912, the one or more memory dies uses the ECC process to correct the bit error responsive to refreshing a memory cell represented by the self-refresh address. For example, the error logic 508 or the refresh control circuitry 608 (including both jointly) can use at least one ECC value to correct the bit error at the error address 314 by recomputing the corrected data 312 during the self-refresh operation or by retrieving from a memory the corrected data 312 that was computed previously during the read operation.

FIG. 10 illustrates a flow diagram for an example process 1000 that implements automated error correction with memory refresh. At block 1002, an apparatus is determining that data includes at least one error, with the data corresponding to an address. For example, error logic 508 can determine that data 310 includes at least one error, with the data 310 corresponding to an address of a memory array 208. For instance, an ECC engine 306 may determine that retrieved data 310 is associated with a stored ECC value that does not match a computed ECC value. If the ECC values do not match, the retrieved data 310 may be deemed error data 408. If the ECC analysis is prompted by a read command (as opposed to a refresh operation), the address may be labeled an error address 314 and stored in a buffer memory 304 for subsequent comparison to refresh addresses 406. If the ECC analysis is prompted by a refresh operation, the error data 408 can be corrected while a row is already sensed. Alternatively, the error address 314 may be stored in a buffer memory for correction at a subsequent refresh operation (e.g., if the ECC analysis is too slow for the refresh operation to "pause" while the ECC analysis is conducted).

At block 1004, an apparatus is writing corrected data at the address in conjunction with a refresh operation, which includes the address, based on the determination. For example, error logic 508 or refresh control circuitry 608 (including both jointly) can write corrected data 312 at the address in conjunction with a refresh operation 510 based on the determination of the at least one error. Here, the refresh operation 510 is directed to at least the address of the data that is determined to have at least one error. In some cases, the corrected data 312 may be recomputed prior to the refresh operation 510 reaching the address by comparing an upcoming refresh address 406 with one or more stored error addresses 314.

In some implementations of the process 1000, the apparatus can be sensing the data as part of at least one refresh operation and determining that the data includes the at least one error based on the sensing. In some cases, the refresh operation and the at least one refresh operation may be a same refresh operation. In other cases, the at least one refresh operation precedes the refresh operation. In terms of address order or whether one or more addresses may be "skipped" in a given refresh operation, the apparatus can be checking data integrity at consecutive refresh addresses as part of the at least one refresh operation. Alternatively, the apparatus can be checking data integrity at nonconsecutive refresh addresses as part of the at least one refresh operation.

For the flow chart(s) and flow diagram(s) described above, the orders in which operations are shown and/or described are not intended to be construed as a limitation. Any number or combination of the described process operations can be combined or rearranged in any order to implement a given method or an alternative method. Operations may also be omitted from or added to the described methods. Further, described operations can be implemented in fully or partially overlapping manners.

Aspects of these methods may be implemented in, for example, hardware (e.g., fixed-logic circuitry or a processor in conjunction with a memory), firmware, software, or some combination thereof. The methods may be realized using one or more of the apparatuses or components or other items shown in FIGS. 1 to 8-2, the aspects of which may be further divided, combined, rearranged, and so on. The devices and components of these figures generally represent hardware, such as electronic devices, packaged modules, IC chips, or circuits; firmware or the actions thereof; software; or a combination thereof. Thus, these figures illustrate some of the many possible systems or apparatuses capable of implementing the described methods.

Examples of multiple implementations are described below.

Example 1: A memory device comprising: at least one memory array comprising multiple memory cells; at least one buffer memory; and error logic coupled to the at least one memory array and the at least one buffer memory, the error logic configured to: determine that data includes at least one error, the data corresponding to an address that is associated with the at least one memory array; store at least part of the address in the at least one buffer memory based on determining the at least one error; and write corrected data at the address of the at least one memory array in conjunction with a refresh operation that includes the address.

Example 2: The memory device of example 1, wherein the at least one buffer memory comprises at least one latch.

Example 3: The memory device of one of example 1 or example 2, wherein the at least one buffer memory comprises an array of memory storage locations.

Example 4: The memory device of any one of the preceding examples, further comprising: control circuitry configured to read the data from the at least one memory array responsive to a read command that indicates the address.

Example 5: The memory device of any one of the preceding examples, further comprising: an interface configured to couple to an interconnect that is coupled to a host device, wherein: the error logic is coupled to the interface; and the error logic is configured to: forward the corrected data to the interface responsive to the read command.

Example 6: The memory device of any one of the preceding examples, wherein: the error logic comprises error correction code (ECC) circuitry; and the ECC circuitry is configured to determine that the data includes the at least one error using an ECC value corresponding to the data.

Example 7: The memory device of any one of the preceding examples, wherein the at least one memory array is configured to store the data in association with the ECC value that corresponds to the data.

Example 8: The memory device of any one of the preceding examples, wherein: the at least one memory array comprises multiple memory banks; the ECC circuitry comprises an ECC engine; and the ECC engine is configured to determine ECC values for different memory banks of the multiple memory banks to share the ECC circuitry between two or more memory banks.

Example 9: The memory device of any one of the preceding examples, wherein: the at least one memory array comprises multiple memory banks; the ECC circuitry comprises multiple ECC engines; respective ECC engines of the multiple ECC engines are coupled to respective memory banks of the multiple memory banks; and a respective ECC engine is configured to determine ECC values for a respective memory bank of the multiple memory banks.

Example 10: The memory device of any one of the preceding examples, wherein the error logic is configured to: write the corrected data at the address of the at least one memory array as part of a read-modify-write operation.

Example 11: The memory device of any one of the preceding examples, wherein the error logic is configured to: store the corrected data in the at least one buffer memory in association with at least part of the address; and write the corrected data at the address of the at least one memory array using the corrected data that is stored in the at least one buffer memory.

Example 12: The memory device of any one of the preceding examples, further comprising: refresh control circuitry configured to perform one or more refresh operations on the at least one memory array.

Example 13: The memory device of any one of the preceding examples, wherein the one or more refresh operations comprise one or more self-refresh operations.

Example 14: The memory device of any one of the preceding examples, wherein the refresh control circuitry and the error logic are jointly configured to: determine at least one refresh address for the one or more refresh operations; and write the corrected data at the address of the at least one memory array based on the at least one refresh address.

Example 15: The memory device of any one of the preceding examples, wherein the refresh control circuitry and the error logic are jointly configured to: compare at least a portion of the refresh address to at least part of the address; and write the corrected data at the address of the at least one memory array based on the comparison.

Example 16: The memory device of any one of the preceding examples, further comprising: control circuitry configured to enable or disable the error logic to write the corrected data at the address of the at least one memory array based on at least one command received from a host device.

Example 17: The memory device of any one of the preceding examples, wherein the memory device comprises low-power double data rate (LPDDR) synchronous dynamic random-access memory (SDRAM).

Example 18: The memory device of any one of the preceding examples, wherein the memory device comprises at least one die.

Example 19: The memory device of any one of the preceding examples, wherein the memory device comprises a memory module with multiple memory dies that include the at least one die.

Example 20: A method comprising: determining that data includes at least one error, the data corresponding to an address; and writing corrected data at the address in conjunction with a refresh operation, which includes the address, based on the determining.

Example 21: The method of example 20, further comprising: reading the data responsive to a read command; and determining that the data includes the at least one error based on the reading.

Example 22: The method of one of example 20 or example 21, further comprising: forwarding the corrected data to an interface coupled to an interconnect based on the determining and responsive to the read command.

Example 23: The method of any one of examples 20-22, further comprising: storing at least part of the address based on the determining.

Example 24: The method of any one of examples 20-23, further comprising: latching at least part of the address to retain the address.

Example 25: The method of any one of examples 20-24, further comprising: determining at least one refresh address as part of the refresh operation; and writing the corrected data at the address based on the at least one refresh address and the address corresponding to the data.

Example 26: The method of any one of examples 20-25, further comprising: sensing the data as part of at least one refresh operation; and determining that the data includes the at least one error based on the sensing.

Example 27: The method of any one of examples 20-26, wherein the refresh operation and the at least one refresh operation are a same refresh operation.

Example 28: The method of any one of examples 20-27, wherein the at least one refresh operation precedes the refresh operation.

Example 29: The method of any one of examples 20-28, further comprising: checking data integrity at consecutive refresh addresses as part of the at least one refresh operation.

Example 30: The method of any one of examples 20-29, further comprising: checking data integrity at nonconsecutive refresh addresses as part of the at least one refresh operation.

Example 31: A method comprising: receiving a read command from an interconnect via an interface, the read command including an address; reading data from at least one memory array based on the address included in the read command; checking integrity of the data based on at least one error correction code (ECC) value; determining that the data includes at least one error based on the checking; and storing at least part of the address based on the determining.

Example 32: The method of example 31, further comprising: determining a refresh address for a refresh operation on the at least one memory array; comparing the refresh address to at least part of the address that is stored; determining corrected data using the data and the ECC value based on the comparing; and writing the corrected data to the at least one memory array in conjunction with the refresh operation.

Example 33: The method of one of example 31 or example 32, further comprising: determining corrected data using the data and the ECC value based on the determining that the data includes the at least one error; and providing the corrected data to the interconnect via the interface.

Example 34: An apparatus comprising: at least one memory array; error correction code (ECC) logic configured to perform an ECC process for data stored in the at least one memory array; a buffer memory; and control circuitry that is configured to perform an automated error correction process with memory refresh, the automated error correction process comprising: determining that a memory address of the at least one memory array is associated with at least one bit-error during a read operation using the ECC logic; writing the memory address to the buffer memory; entering a self-refresh mode for the at least one memory array; determining that a refresh address matches the memory address; and correcting the at least one bit-error in conjunction with refreshing one or more memory cells that are represented by the refresh address.

Example 35: The apparatus of example 34, wherein the apparatus includes a memory device comprising low-power double data rate synchronous dynamic random-access memory (LPDDR SDRAM).

Example 36: The apparatus of one of example 34 or example 35, wherein the buffer memory comprises a latch circuit.

Example 37: A method comprising: operating a package comprising one or more memory dies in an architecture in which an error correction code (ECC) process is automated in response to a self-refresh command; determining that a memory address has at least one bit-error during a read operation based on at least one ECC value; writing the memory address to a buffer memory; entering a self-refresh mode in response to the self-refresh command; determining that a self-refresh address matches the memory address; and correcting the at least one bit-error responsive to refreshing one or more memory cells represented by the self-refresh address based on the determining that the self-refresh address matches the memory address.

Example 38: The method of example 37, wherein the one or more memory dies comprise low-power dynamic random-access memory (DRAM).

Unless context dictates otherwise, use herein of the word "or" may be considered use of an "inclusive or," or a term that permits inclusion or application of one or more items that are linked by the word "or" (e.g., a phrase "A or B" may be interpreted as permitting just "A," as permitting just "B," or as permitting both "A" and "B"). Also, as used herein, a phrase referring to "at least one of" a list of items refers to any combination of those items, including single members. For instance, "at least one of a, b, or c" can cover a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c, or any other ordering of a, b, and c). Further, items represented in the accompanying figures and terms discussed herein may be indicative of one or more items or terms, and thus reference may be made interchangeably to single or plural forms of the items and terms in this written description.

CONCLUSION

Although implementations for automated error correction with memory refresh have been described in language specific to certain features and/or methods, the subject of the appended claims is not necessarily limited to the specific features or methods described. Rather, the specific features and methods are disclosed as example implementations for automated error correction with memory refresh.

What is claimed is:

1. A memory device comprising:
    at least one memory array comprising multiple memory cells;
    at least one buffer memory;
    error logic coupled to the at least one memory array and the at least one buffer memory, the error logic configured to:
        determine that data includes at least one error, the data corresponding to an address that is associated with the at least one memory array; and
        store at least part of the address in the at least one buffer memory based on a determination that the data includes the at least one error; and
    refresh control circuitry coupled to the at least one memory array, the refresh control circuitry configured to:
        write corrected data at the address that is associated with the at least one memory array in conjunction with a refresh operation that includes the address effective to obviate correction of the at least one error with a separate write operation.

2. The memory device of claim 1, wherein the at least one buffer memory comprises at least one latch.

3. The memory device of claim 1, wherein the at least one buffer memory comprises an array of memory storage locations.

4. The memory device of claim 1, further comprising:
    control circuitry configured to read the data from the at least one memory array responsive to a read command that indicates the address.

5. The memory device of claim 4, further comprising:
    an interface configured to couple to an interconnect that is coupled to a host device, wherein:
        the error logic is coupled to the interface; and
        the error logic is configured to:
            forward the corrected data to the interface responsive to the read command.

6. The memory device of claim 1, wherein:
    the error logic comprises error correction code (ECC) circuitry; and
    the ECC circuitry is configured to determine that the data includes the at least one error using an ECC value corresponding to the data.

7. The memory device of claim 6, wherein the at least one memory array is configured to store the data in association with the ECC value that corresponds to the data.

8. The memory device of claim 1, wherein:
    the error logic is configured to store the corrected data in the at least one buffer memory in association with the at least part of the address; and
    the refresh control circuitry is configured to write the corrected data at the address that is associated with the at least one memory array using the corrected data that is stored in the at least one buffer memory.

9. The memory device of claim 1, wherein the refresh control circuitry is configured to:
    write the corrected data at the address that is associated with the at least one memory array in conjunction with the refresh operation to eliminate a normal replacement operation for writing the corrected data to the address.

10. The memory device of claim 1, wherein the refresh control circuitry is configured to:
    perform one or more refresh operations on the at least one memory array.

11. The memory device of claim 10, wherein the one or more refresh operations comprise one or more self-refresh operations.

12. The memory device of claim 10, wherein the refresh control circuitry is configured to:
    determine at least one refresh address for the one or more refresh operations; and
    write the corrected data at the address that is associated with the at least one memory array based on the at least one refresh address.

13. The memory device of claim 12, wherein the refresh control circuitry is configured to:
    compare at least a portion of the at least one refresh address to the at least part of the address; and
    write the corrected data at the address that is associated with the at least one memory array based on the comparison.

14. The memory device of claim 1, wherein the refresh control circuitry is configured to:
    write the corrected data at the address that is associated with the at least one memory array as part of a read-modify-write operation for the refresh operation.

15. The memory device of claim 1, further comprising:
    control circuitry configured to enable or disable the refresh control circuitry to write the corrected data at the address that is associated with the at least one memory array based on at least one command received from a host device.

16. The memory device of claim 1, wherein the memory device comprises at least one die.

17. The memory device of claim 16, wherein the memory device comprises a memory module with multiple memory dies that include the at least one die.

18. A method comprising:
receiving a read command from a host device;
reading data responsive to the read command;
detecting that the data includes at least one error based on the reading, the data corresponding to an address;
storing at least part of the address based on the detecting;
determining that the at least part of the address matches a refresh address of a refresh operation; and
writing corrected data at the address in conjunction with the refresh operation based on the detecting and the determining to obviate correction of the at least one error with a separate write operation.

19. The method of claim 18, further comprising:
storing the corrected data in association with the at least part of the address based on the detecting to produce stored corrected data;
retrieving the stored corrected data based on the determining to produce retrieved corrected data; and
writing the corrected data at the address in conjunction with the refresh operation using the retrieved corrected data.

20. A memory device comprising:
at least one memory array comprising multiple memory cells;
at least one buffer memory;
error logic coupled to the at least one memory array and the at least one buffer memory, the error logic configured to:
determine that data includes at least one error, the data corresponding to an address that is associated with the at least one memory array; and
store at least part of the address in the at least one buffer memory based on a determination that the data includes the at least one error; and
means for writing corrected data at the address that is associated with the at least one memory array in conjunction with a refresh operation that includes the address so that a normal replacement operation for writing the corrected data to the address is eliminated.

* * * * *